(12) United States Patent
Kishimoto

(10) Patent No.: US 10,741,800 B2
(45) Date of Patent: Aug. 11, 2020

(54) METHOD FOR MANUFACTURING ORGANIC EL DEVICE, INCLUDING A THIN FILM ENCAPSULATION STRUCTURE FILM-FORMING METHOD, AND FILM-FORMING APPARATUS FOR THE SAME

(71) Applicant: SAKAI DISPLAY PRODUCTS CORPORATION, Sakai-shi, Osaka (JP)

(72) Inventor: Katsuhiko Kishimoto, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/491,067

(22) PCT Filed: Mar. 16, 2017

(86) PCT No.: PCT/JP2017/010736
§ 371 (c)(1),
(2) Date: Sep. 4, 2019

(87) PCT Pub. No.: WO2018/167923
PCT Pub. Date: Sep. 20, 2018

(65) Prior Publication Data
US 2020/0020892 A1 Jan. 16, 2020

(51) Int. Cl.
*H01L 51/56* (2006.01)
*H01L 27/32* (2006.01)
(Continued)

(52) U.S. Cl.
CPC .............. *H01L 51/56* (2013.01); *H01L 27/32* (2013.01); *H01L 51/0001* (2013.01);
(Continued)

(58) Field of Classification Search
CPC .. H01L 51/56; H01L 51/5237; H01L 51/0001
See application file for complete search history.

(56) References Cited

U.S. PATENT DOCUMENTS

2009/0140438 A1 6/2009 Yamazaki et al.
2012/0228754 A1* 9/2012 Liu .................... H01L 23/13
257/676
(Continued)

FOREIGN PATENT DOCUMENTS

JP 2009-158940 A 7/2009
JP 2013-026394 A 2/2013
(Continued)

*Primary Examiner* — Quoc D Hoang
(74) *Attorney, Agent, or Firm* — ScienBiziP, P.C.

(57) ABSTRACT

The film-forming method according to an embodiment of the present invention includes: a step A for forming a photocurable resin liquid film on a substrate; a step B for vaporizing the photocurable resin in a first region on the substrate by selectively irradiating the first region with infrared rays or visible light having a wavelength that is longer than 550 nm; and a step C for obtaining a photocured resin film by curing the photocurable resin in the second region on the substrate, said second region including the first region, by irradiating, simultaneously with the step 3 or after performing the step 3, the second region with light, to which the photocurable resin is sensitive.

18 Claims, 20 Drawing Sheets

(51) Int. Cl.
 *H01L 51/00* (2006.01)
 *H01L 51/52* (2006.01)
(52) U.S. Cl.
 CPC ...... *H01L 51/0097* (2013.01); *H01L 51/5237* (2013.01); *H01L 2251/5338* (2013.01)

(56) References Cited

U.S. PATENT DOCUMENTS

| | | |
|---|---|---|
| 2014/0167018 A1 | 6/2014 | Okumoto et al. |
| 2016/0020429 A1 | 1/2016 | Kuroki |
| 2016/0043346 A1 | 2/2016 | Kamiya et al. |
| 2016/0126495 A1* | 5/2016 | Oka .................. H01L 51/5246 257/40 |
| 2017/0324061 A1 | 11/2017 | Sonoda et al. |

FOREIGN PATENT DOCUMENTS

| | | |
|---|---|---|
| JP | 2013-064187 A | 4/2013 |
| JP | 2013-186971 A | 9/2013 |
| JP | 2014-228594 A | 12/2014 |
| JP | 2015-176717 A | 10/2015 |
| JP | 2016-039120 A | 3/2016 |
| WO | 2014/129536 A1 | 8/2014 |
| WO | 2014/196137 A1 | 12/2014 |
| WO | 2016/060053 A1 | 4/2016 |

\* cited by examiner

FIG.2
(a)
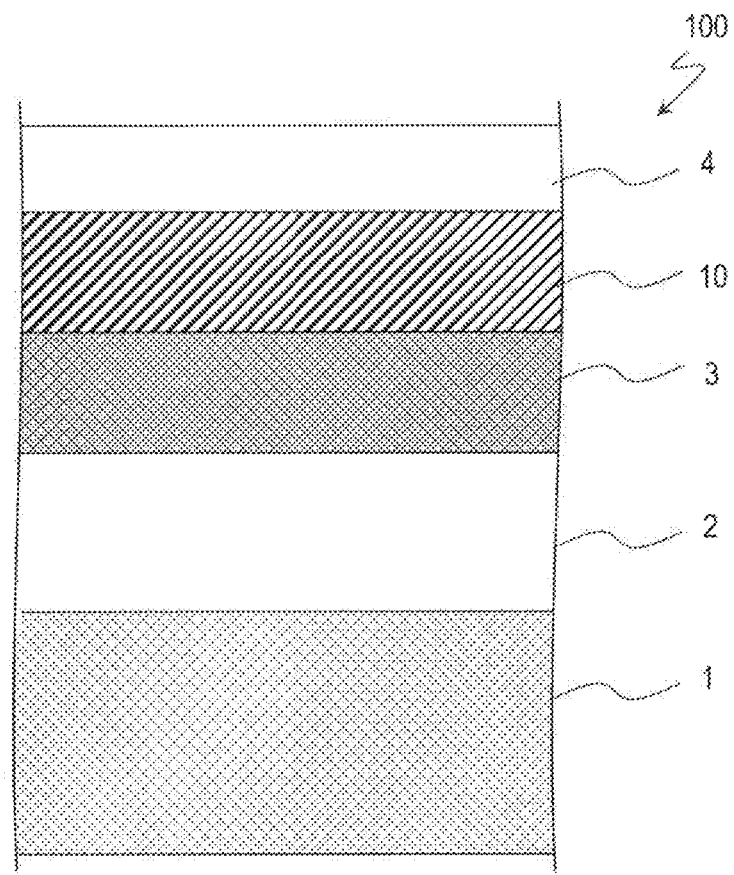
(b)
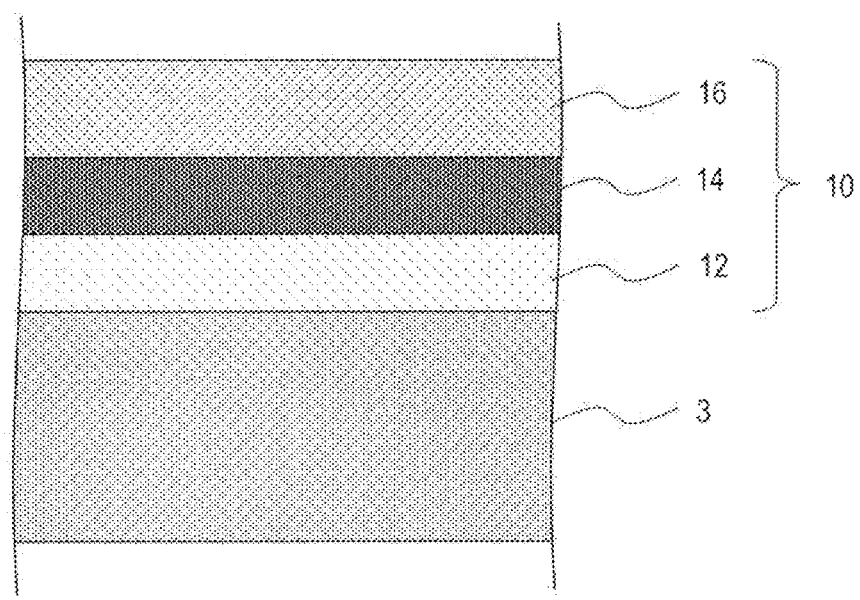

FIG.4
(a) 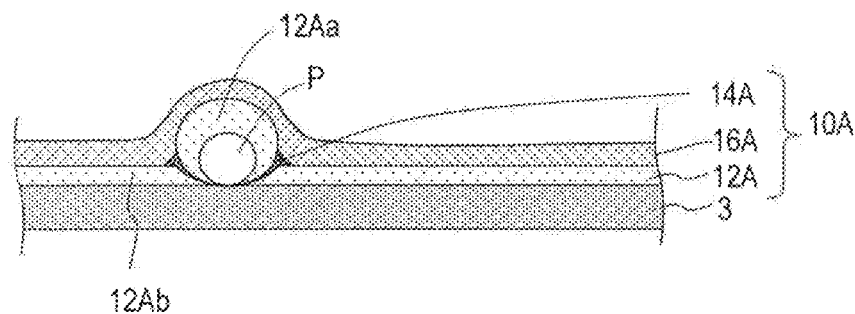
(b) 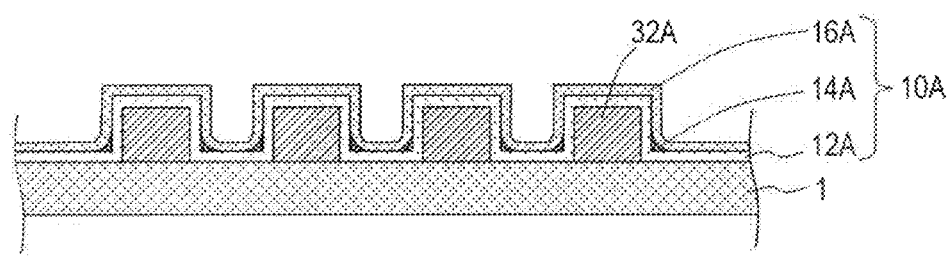
(c) 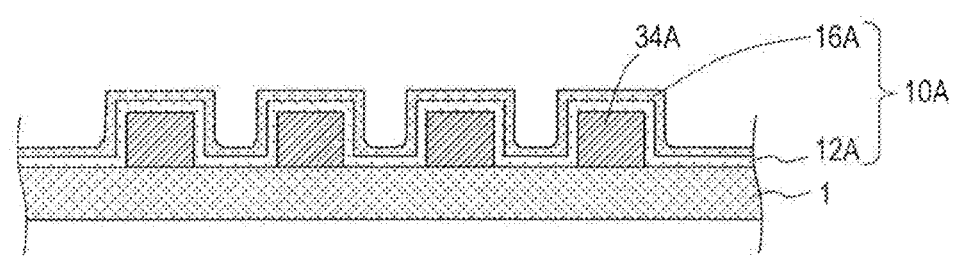
(d) 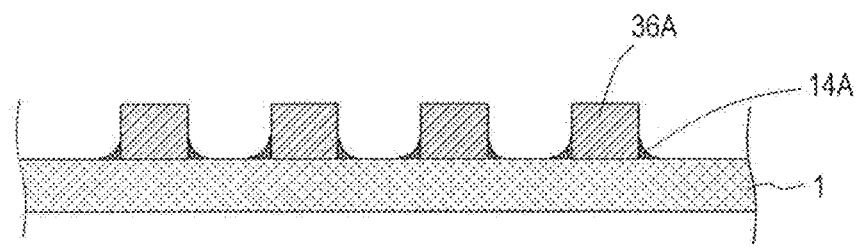
(e) 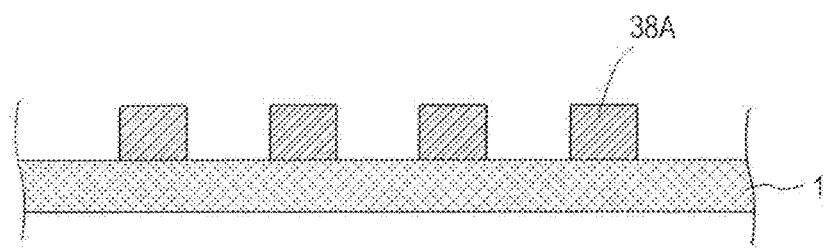

FIG.5
(a)
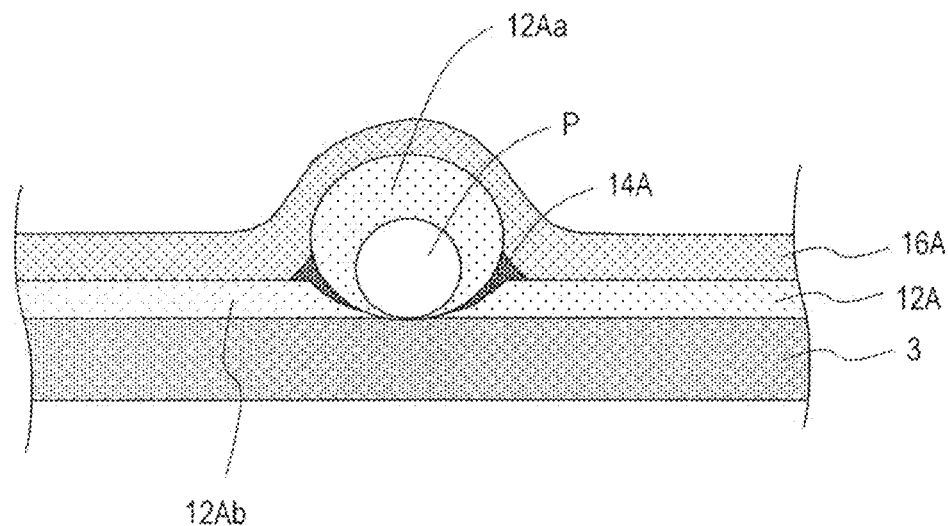
(b)
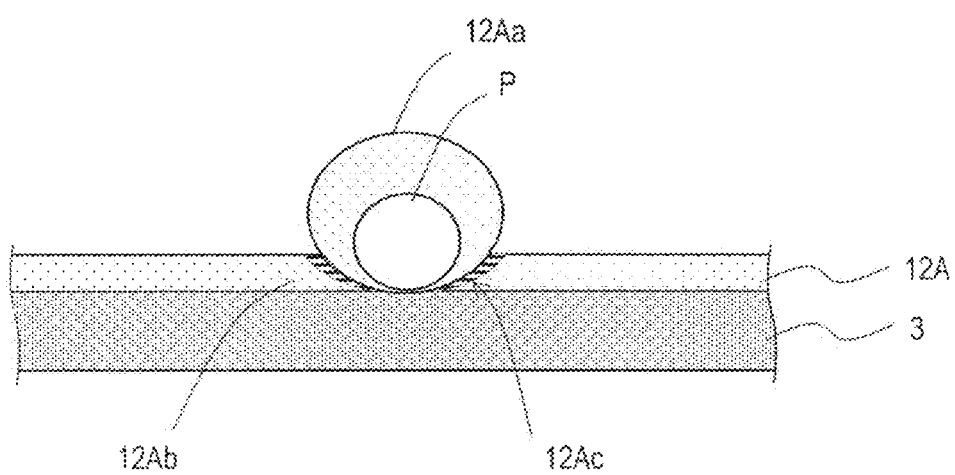

FIG. 7
(a)
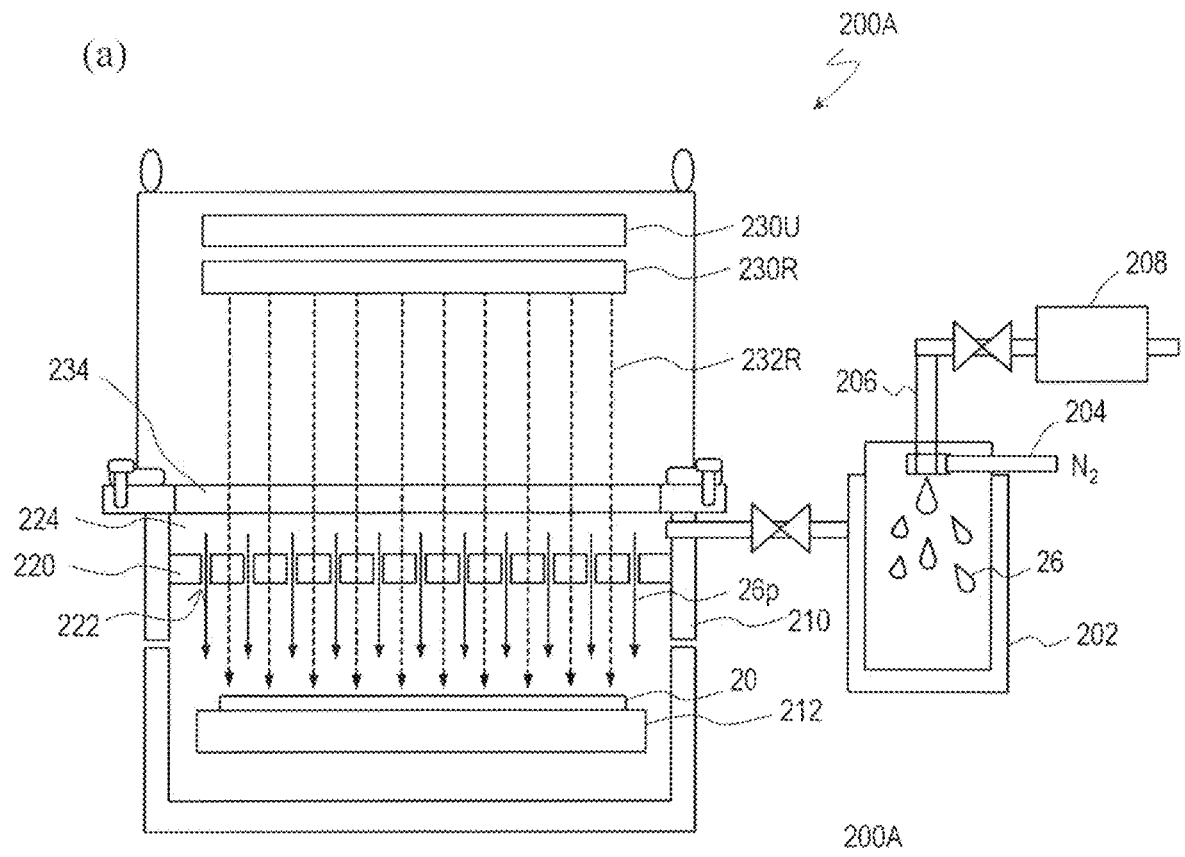
(b)
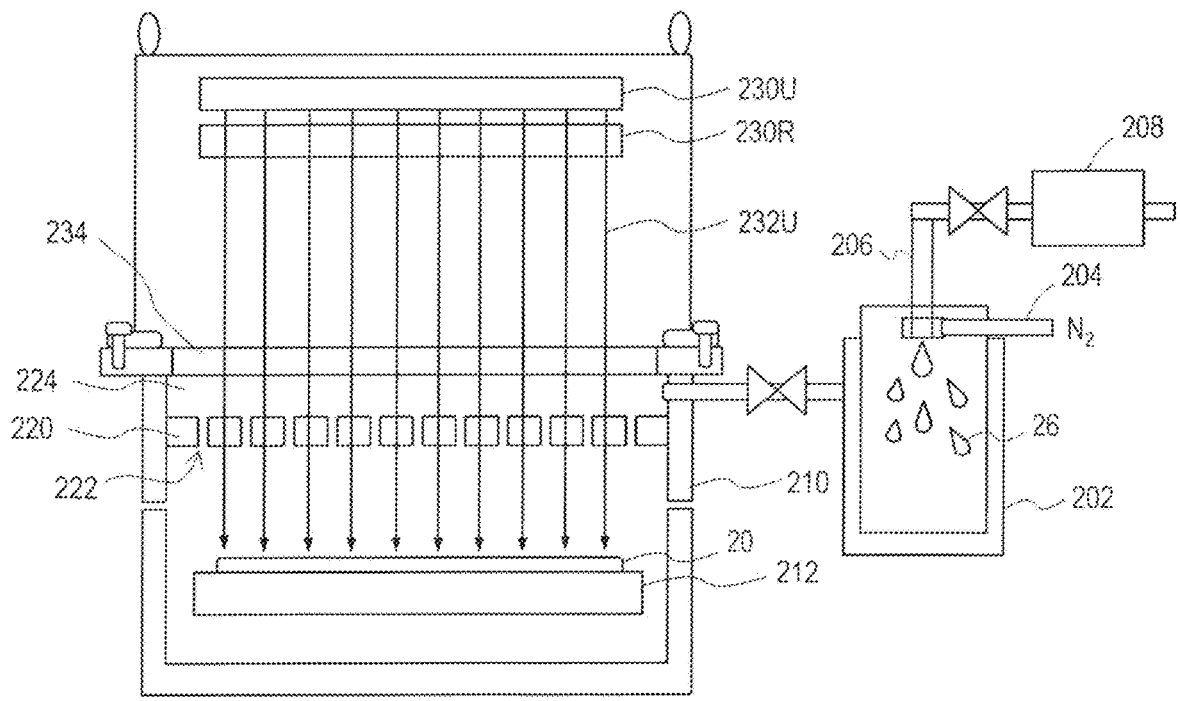

FIG.8
(a)
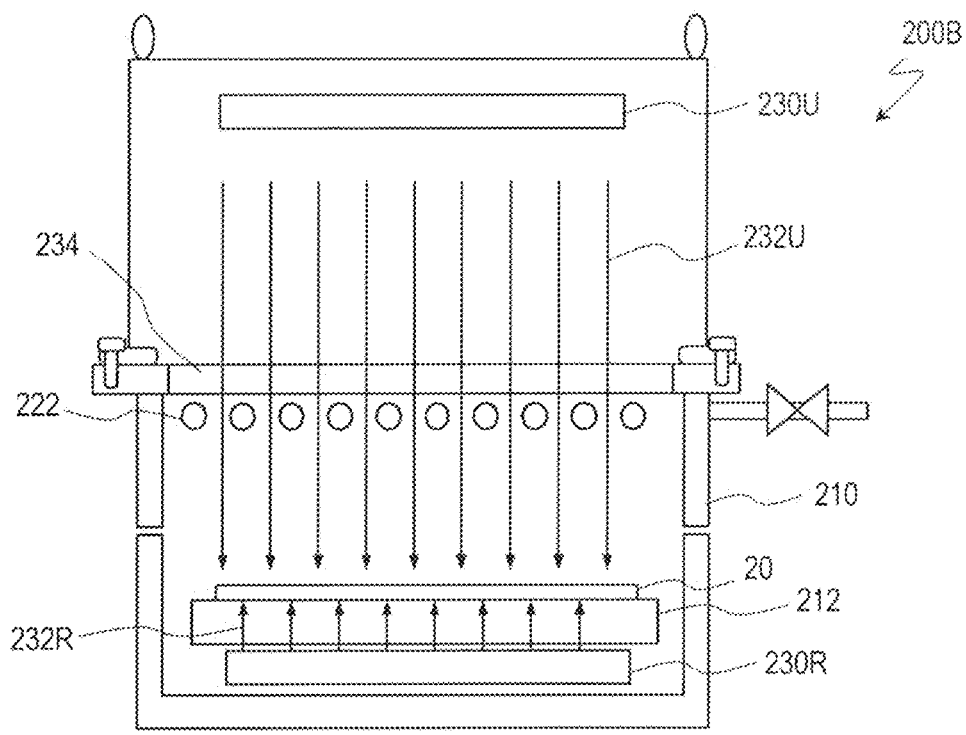
(b)
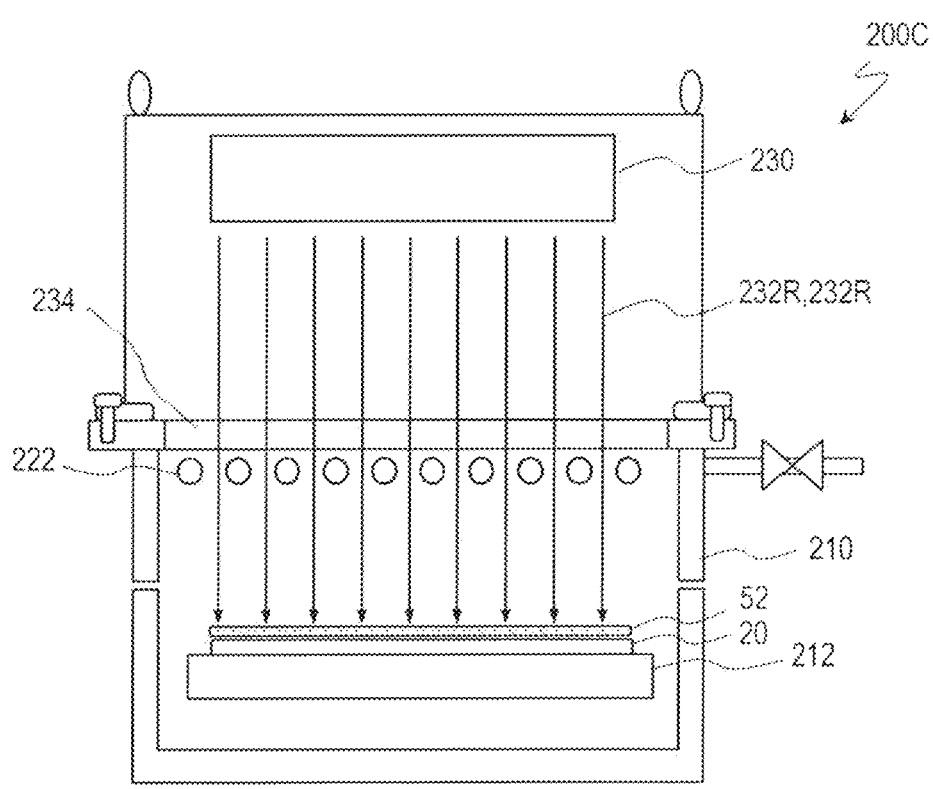

FIG. 9
(a)
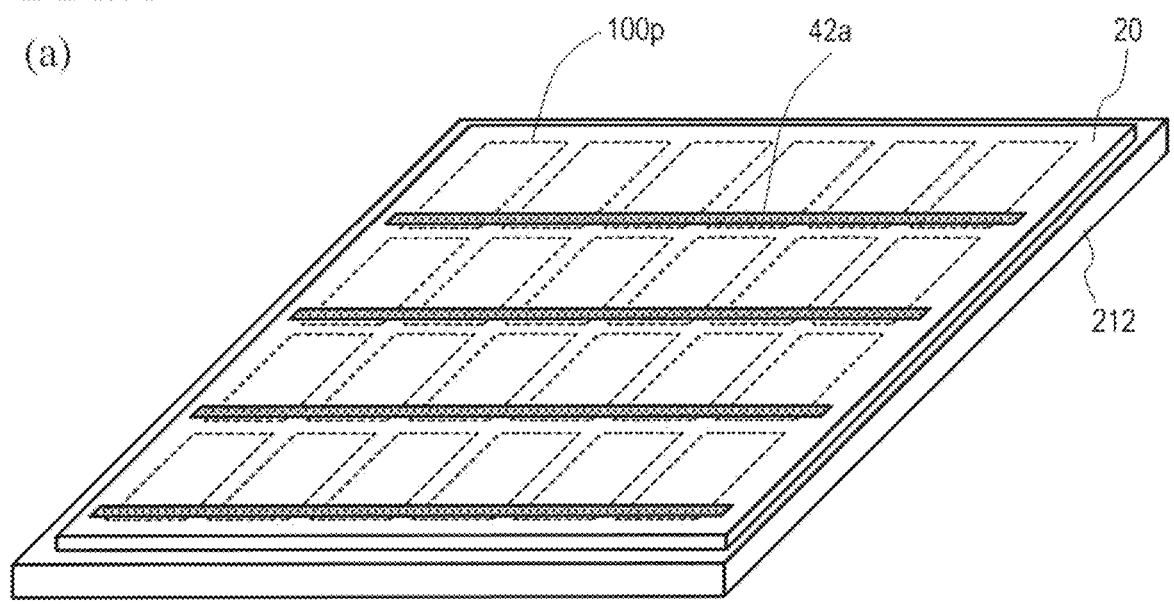
(b)
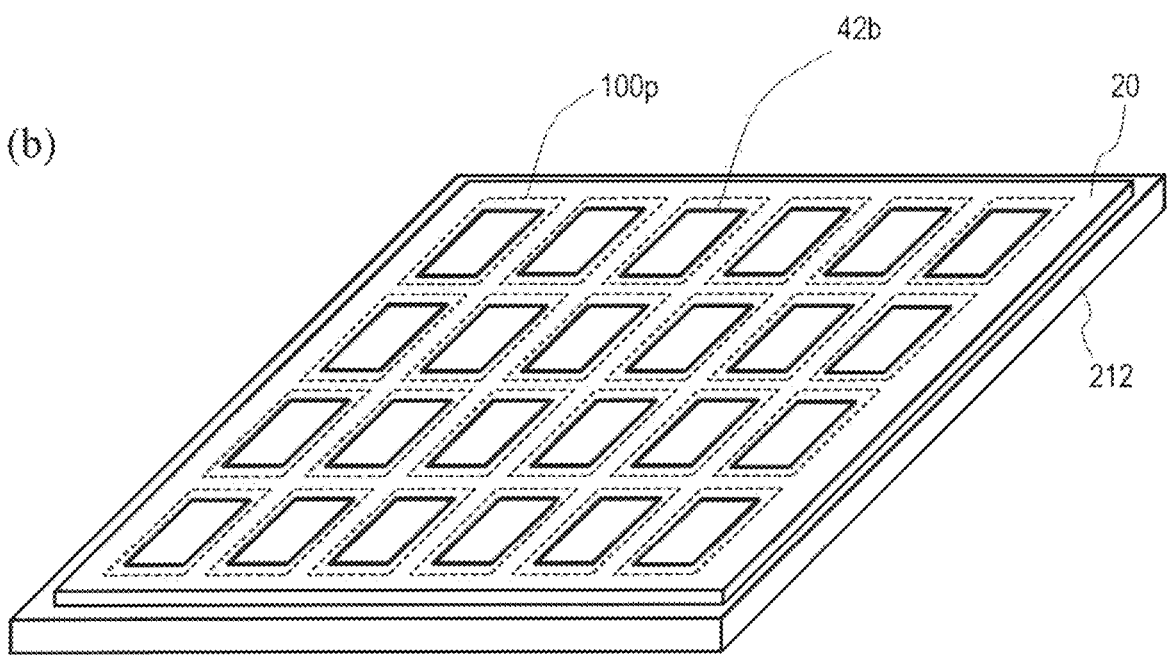

FIG.10
(a)
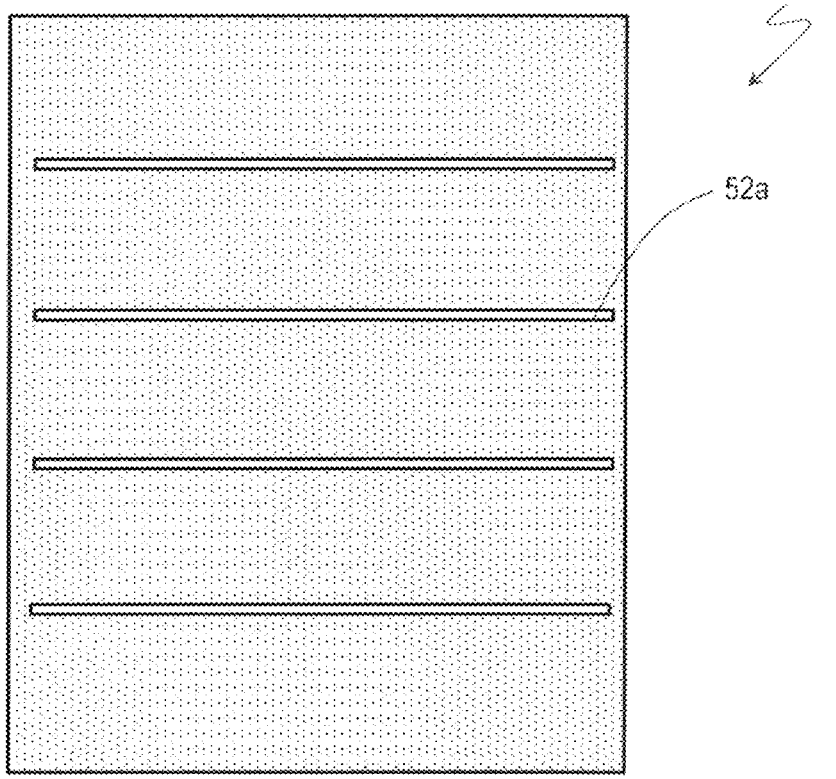
(b)
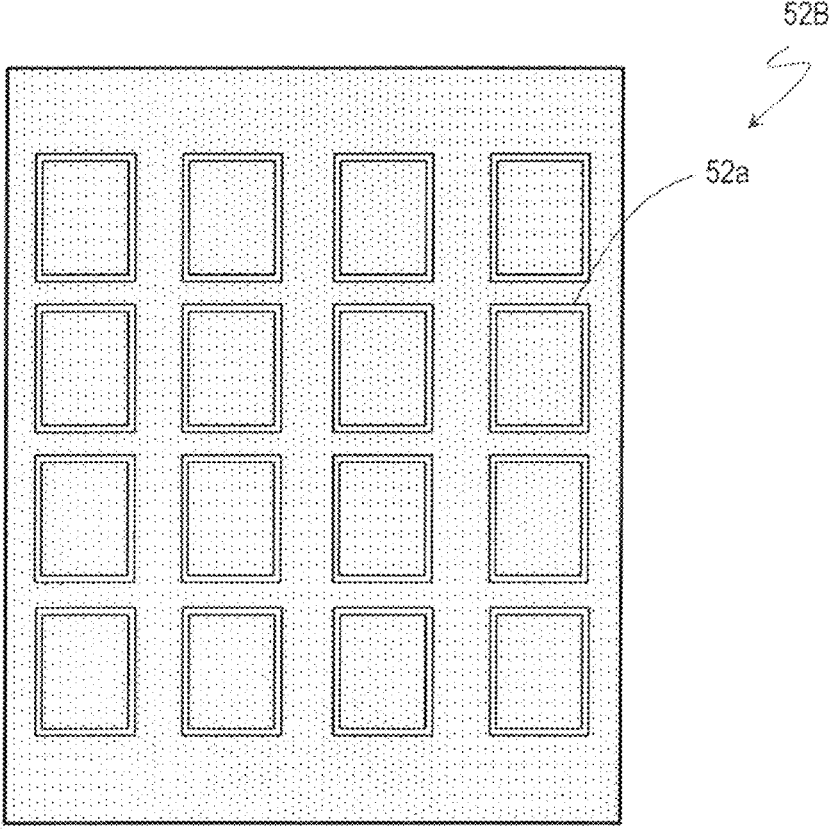

FIG.12
(a)
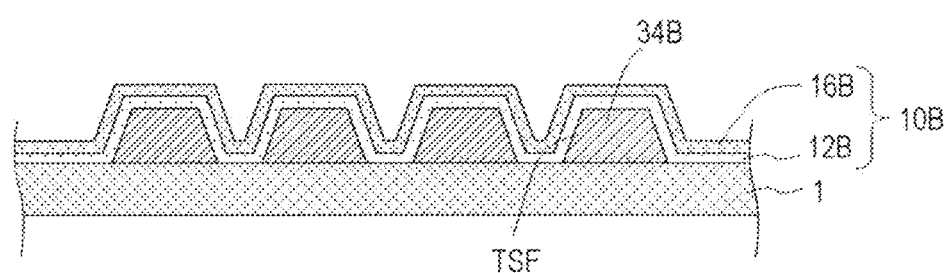
(b)
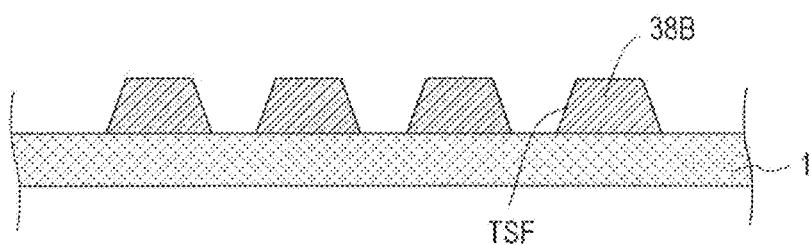

FIG.13
(a)
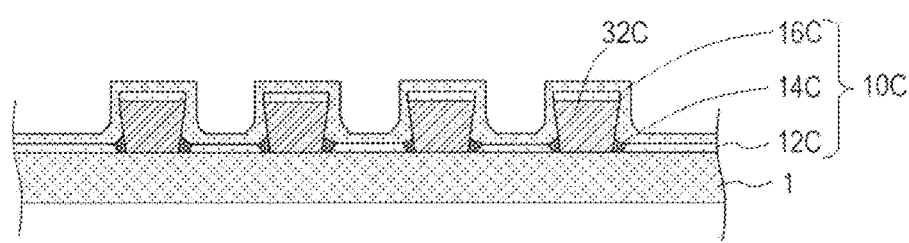
(b)
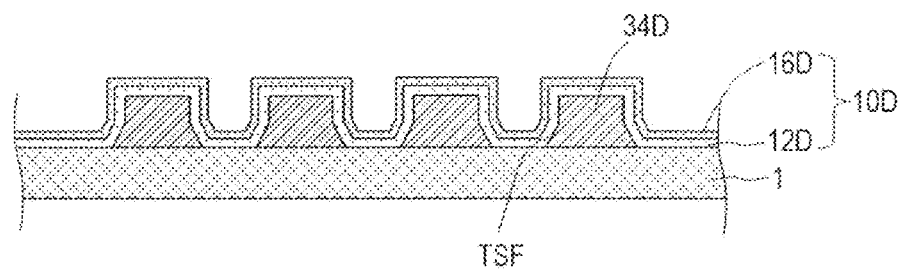
FIG.14
(a)
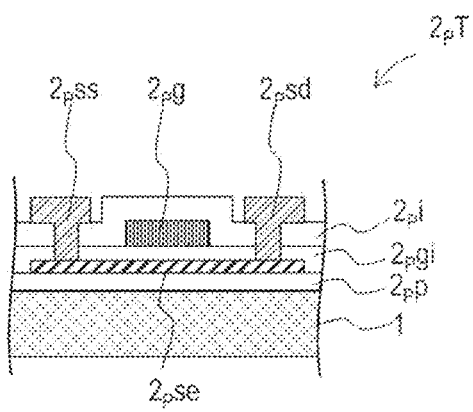
(b)
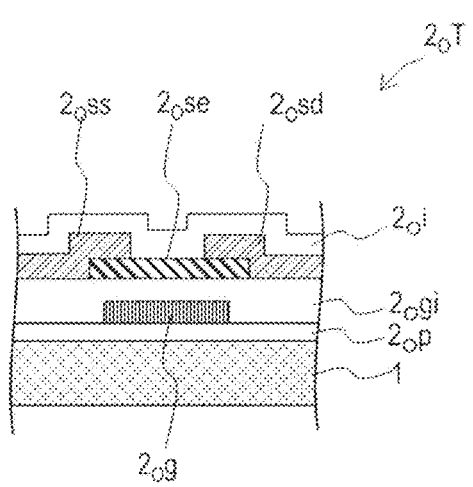

FIG. 15
(a) 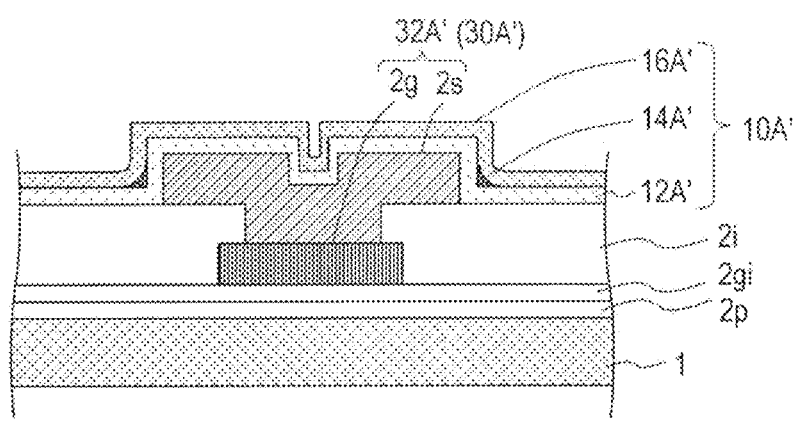
(b) 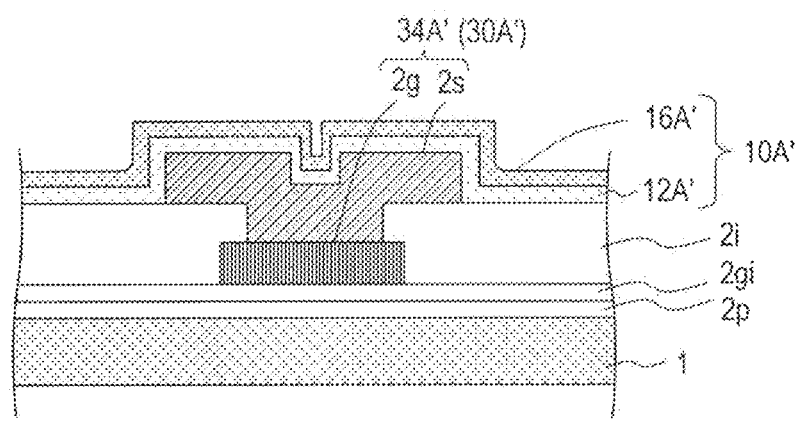
(c) 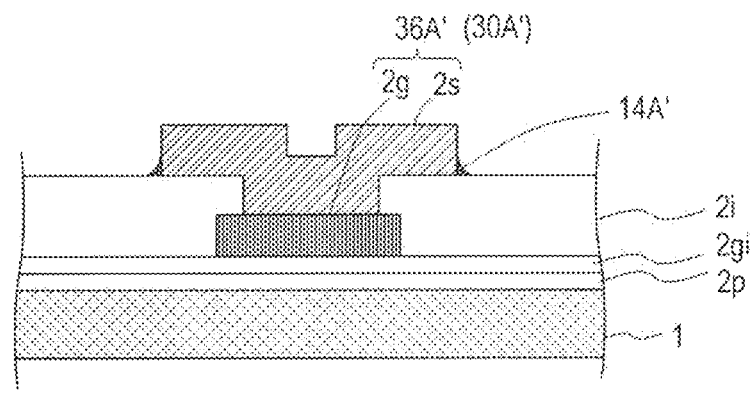
(d) 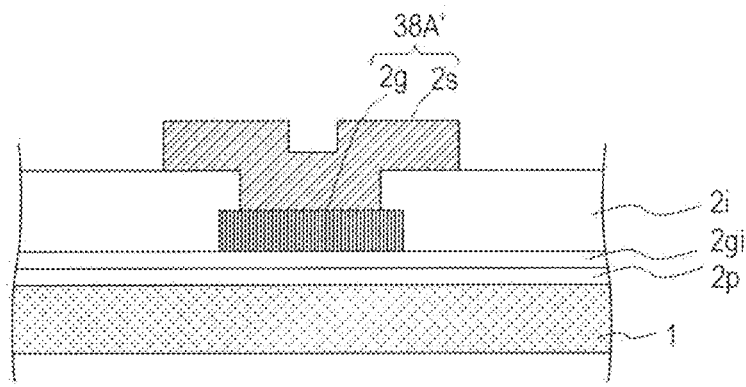

FIG.17
(a)
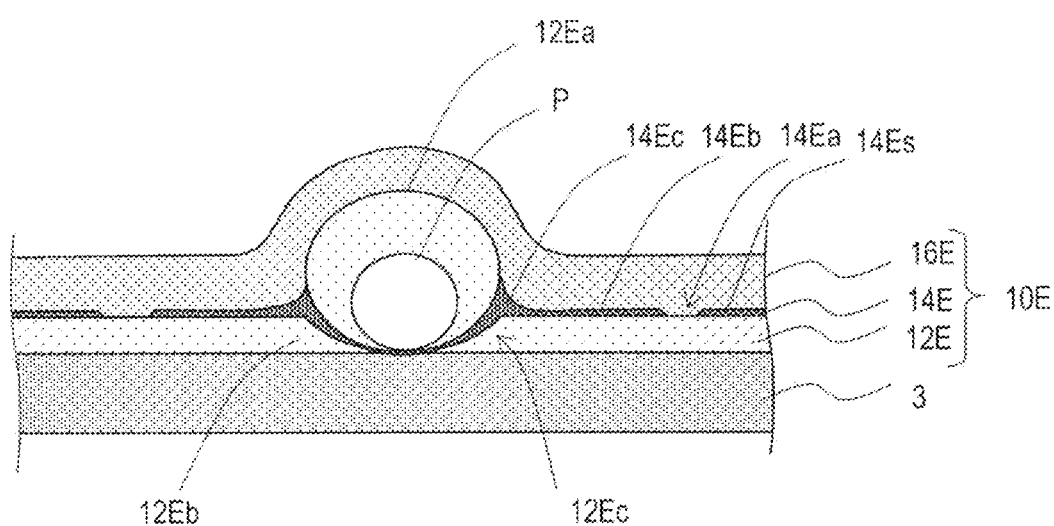
(b)
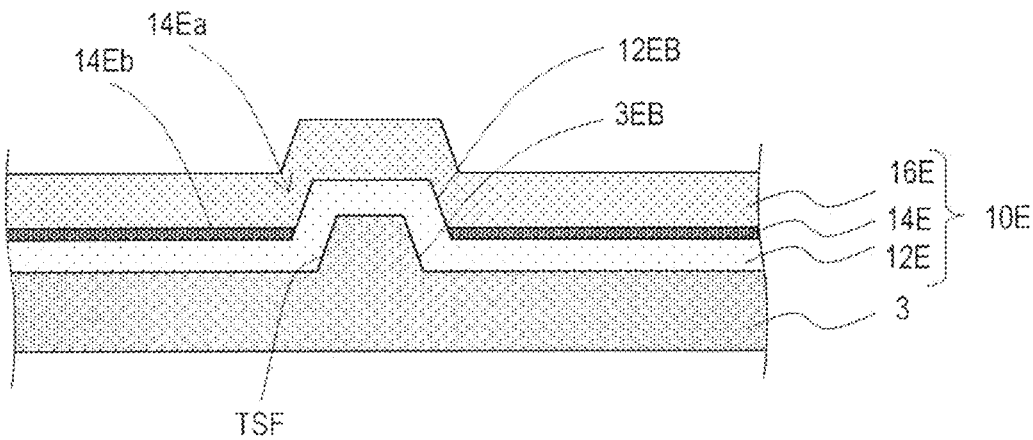

FIG. 20
(a)
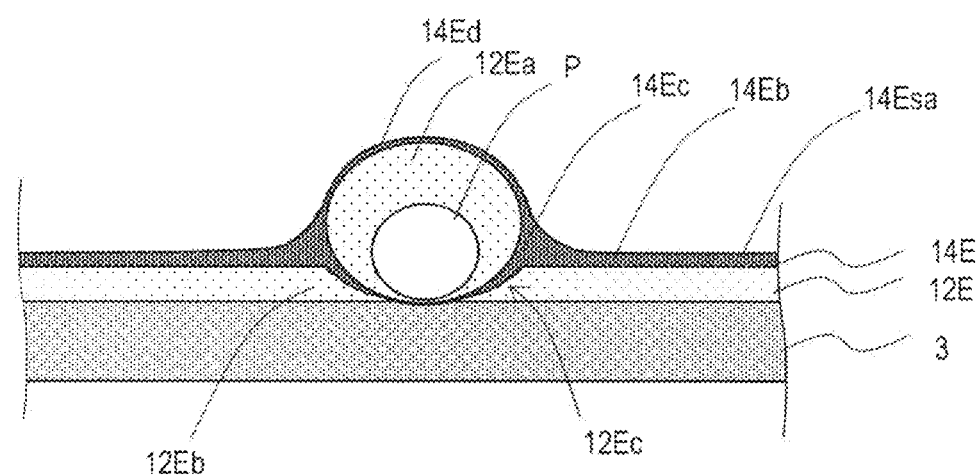
(b)
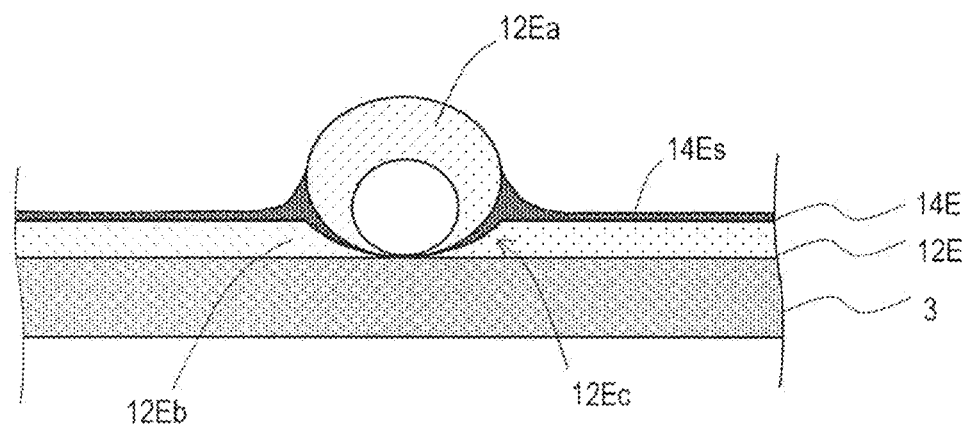
(c)
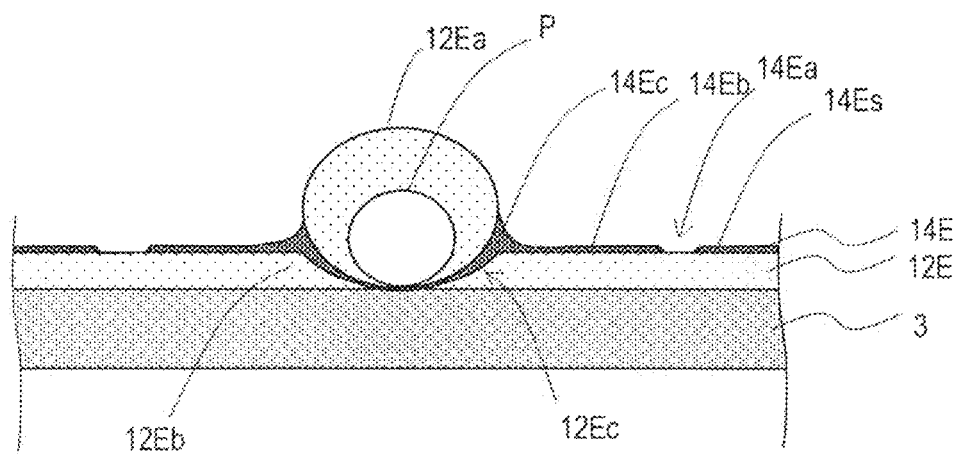

FIG.21
(a)
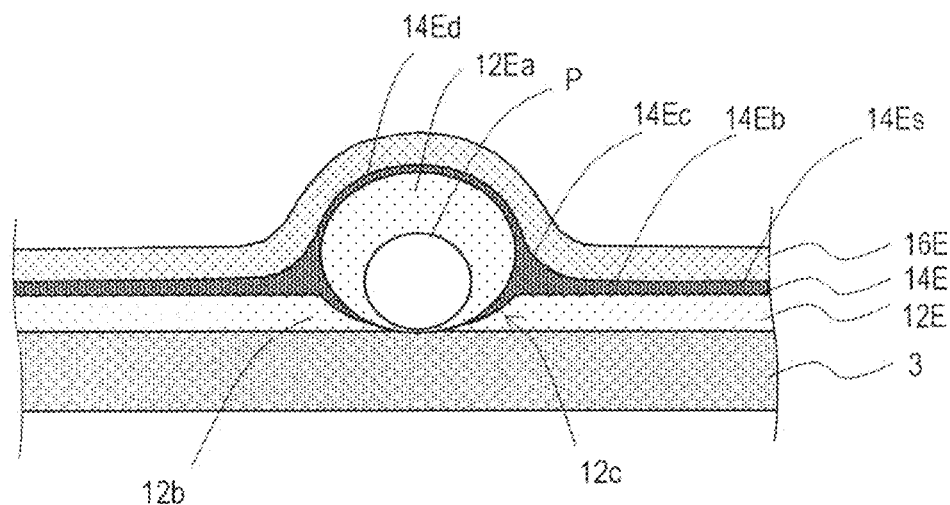
(b)
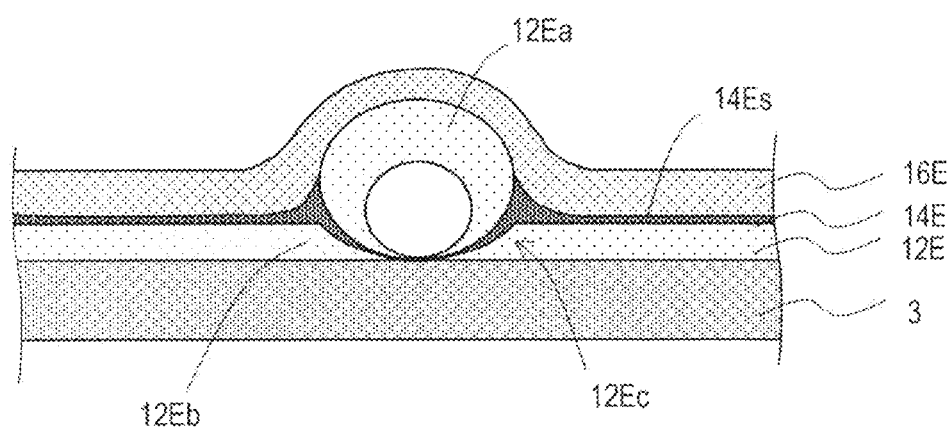
(c)
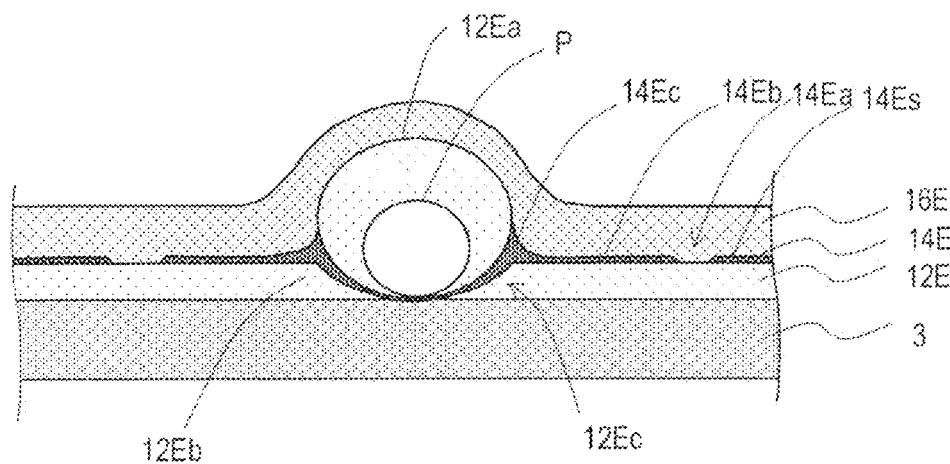

METHOD FOR MANUFACTURING ORGANIC EL DEVICE, INCLUDING A THIN FILM ENCAPSULATION STRUCTURE FILM-FORMING METHOD, AND FILM-FORMING APPARATUS FOR THE SAME

TECHNICAL FIELD

The present invention relates to a method for producing an organic EL device (e.g., organic EL display device and organic EL illumination device), a film formation method, and a film formation device.

BACKGROUND ART

Organic EL (Electroluminescence) display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficient level of water vapor barrier property. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m²/day.

A thin film encapsulation structure used in OLED display devices commercially available currently includes an organic barrier layer (polymer barrier layer) having a thickness of about 5 µm to about 20 µm. Such a relatively thick organic barrier layer also has a role of flattening a surface of the element substrate. However, such a thick organic barrier layer involves a problem of limiting the bendability of the OLED display device.

There is also a problem that the mass-productivity is low. The relatively thick organic barrier layer described above is formed by use of a printing technology such as an inkjet method, a microjet method or the like. By contrast, an inorganic barrier layer is formed by a thin film formation technology in a vacuum atmosphere (e.g., lower than, or equal to, 1 Pa). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

Under such a situation, as disclosed in, for example, Patent Document No. 1, a film formation device capable of producing an inorganic barrier layer and an organic barrier layer continuously has been developed.

Patent Document No. 2 discloses a thin film encapsulation structure including a first inorganic material layer, a first resin member and a second inorganic material layer provided on the element substrate in this order, with the first inorganic barrier layer being closest to the element substrate. In this thin film encapsulation structure, the first resin member is present locally, more specifically, in the vicinity of a protruding portion of the first inorganic material layer (first inorganic material layer covering the protruding portion). According to Patent Document No. 2, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto an element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document No. 3 also discloses an OLED display device including a similar thin film encapsulation structure. Patent Document No. 4 discloses a film formation device usable to produce an OLED display device.

CITATION LIST

Patent Literature

Patent Document No. 1: Japanese Lard-Open Patent Publication No. 2013-186971
Patent Document No. 2: WO2014/196137
Patent Document No. 3: Japanese Laid-Open Patent Publication No. 2016-39120
Patent Document No. 4: Japanese Laid-Open Patent Publication No. 2013-64167

SUMMARY OF INVENTION

Technical Problem

The thin film encapsulation structure described in each of Patent Documents No. 1, 2 and 3 does not include a thick organic barrier layer, and therefore, is considered to improve the bendability of the OLED display device. In addition, since the inorganic barrier layer and the organic barrier layer may be formed continuously, the mass-productivity is also improved.

However, according to the studies made by the present inventor, an organic barrier layer formed by the method described in Patent Document No. 2 or 3 has a problem of not providing a sufficiently high level of moisture-resistance reliability.

In the case where an organic barrier layer is formed by use of a printing method such as an inkjet method or the like, it is possible to form the organic barrier layer only in an active region on the element substrate (the active region may also be referred to as an "element formation region" or a "display region") but not in a region other than the active region. In this case, in the vicinity of the active region (outer to the active region), there is a region where the first inorganic material layer and the second inorganic material layer are in direct contact with each other, and the organic barrier layer is fully enclosed by the first inorganic material layer and the second inorganic material layer and is insulated from the outside of the first inorganic material layer and the second inorganic material layer.

By contrast, according to the method for forming the organic barrier layer described in Patent Document No. 2 or 3, a resin (organic resin) is supplied onto the entire surface of the element substrate, and the surface tension of the liquid-state resin is used to locate the resin locally, more specifically, at the border between the surface of the element substrate and the side surface of the protruding portion on the surface of the element substrate. Therefore, the organic barrier layer may also be undesirably formed in a region other than the active region (the region other than the active region may also be referred to as a "peripheral region"), namely, a terminal region where a plurality of terminals are located and a lead wire region where lead wires extending from the active region to the terminal region are formed. Specifically, the resin is present locally, more specifically, at, for example, the border between side surfaces of the lead wires or side surfaces of the terminals and the surface of the substrate. In this case, an end of the organic barrier layer formed along the lead wires is not enclosed by the first inorganic barrier layer or the second inorganic barrier layer, but is exposed to the air (ambient atmosphere).

The organic barrier layer is lower in the water vapor barrier property than the inorganic barrier layer. Therefore, the organic barrier layer formed along the lead wires acts as a route that leads the water vapor in the air to the active region.

The problem of the thin film encapsulation structure in an organic EL display device including a flexible substrate is described above. The above-described problem is not limited to any particular type of substrate, and is common to an organic EL device including a thin film, encapsulation structure that includes two inorganic barrier layers and an organic barrier layer.

The present invention, made to solve the above-described problem, has an object of providing a method for producing an organic EL device that includes a thin film encapsulation structure including a relatively thin organic barrier layer and is improved in the mass-productivity and the moisture-resistance reliability. The present, invention also has an object of providing a novel film formation method and a novel film formation device realizing formation of a thin film encapsulation structure having a high level of mass-productivity and a high level of moisture-resistance reliability.

Solution to Problem

A film formation method according to an embodiment of the present invention includes step A of forming a liquid film of a photocurable resin on a substrate; step B of selectively irradiating a first region on the substrate with infrared rays or visible light having a wavelength exceeding 550 nm to vaporize the photocurable resin in the first region; and step C of, concurrently with, or after, step B, irradiating a second region including the first region on the substrate with light to which the photocurable resin is photosensitive, to cure the photocurable resin in the second region and thus to obtain a photocurable resin film.

In an embodiment, step A includes step A1 of condensing the photocurable resin, which is vapor-like or mist-like, on the substrate in a chamber accommodating the vapor-like or mist-like photocurable resin.

A method for producing an organic EL device according to an embodiment of the present invention includes the steps of preparing an element substrate including a substrate, a driving circuit formed on the substrate, a plurality of organic EL elements connected with the driving circuit, a plurality of terminals located in a peripheral region outer to an active region, in which the plurality of EL elements are located, and a plurality of lead wires connecting the driving circuit and the plurality of terminals to each other; and forming a thin film encapsulation structure on the active region of the element substrate and a portion of each of the plurality of lead wires, the portion being closer to the active region. The step of forming the thin film encapsulation structure includes step S1 of forming a first inorganic barrier layer selectively on the active region and the portion of each of the plurality of lead wires closer to the active region, step S2 of, after step S1, condensing the photocurable resin, which is vapor-like or mist-like, on the first inorganic barrier layer in a chamber accommodating the photocurable resin, step S3 of, after step S2, selectively irradiating a first region, on the element substrate, including a dividing region crossing the plurality of lead wires with infrared rays or visible light having a wavelength exceeding 550 nm to vaporize the photocurable resin in the first region; step S4 of, concurrently with, or after, step S3, irradiating a second region including the first region on the element substrate with light to which the photocurable resin is photosensitive, to cure the photocurable resin in the second region and thus to form an organic barrier layer formed of the photocurable resin; and step S5 of, after step S4, forming a second inorganic barrier layer selectively in a region where the first inorganic barrier layer is formed to form an inorganic barrier layer joint portion, where the first inorganic barrier layer and the second inorganic barrier layer are in direct contact with each other, in at least the dividing region in the first region. Step S2 may be the step of locating a liquid-state photocurable resin locally, more specifically, only in the vicinity of a protrusion portion of the first inorganic barrier layer, or the step of forming a liquid film of the photocurable resin.

In an embodiment, the method further includes the step of partially ashing the organic barrier layer after step S4 but before step S5.

In an embodiment, the first region includes an annular region substantially enclosing the active region.

In an embodiment, the first region has a width of at least 0.01 mm.

In an embodiment, the organic barrier layer has a thickness of 100 nm or greater and 500 nm or less.

In an embodiment, the photocurable resin contains a vinyl group-containing monomer. It is preferred that the vinyl group-containing monomer contains an acrylic monomer. The photocurable resin may further contain a photoinitiator. The photocurable resin may be a silicone resin.

In an embodiment, the substrate is a flexible substrate. The flexible substrate includes, for example, a polyimide film.

A film formation device according to an embodiment of the present invention includes a chamber; a stage located in the chamber and having a top surface receiving the substrate, the stage being capable of cooling the top surface; a first irradiation optical system irradiating a first region on the substrate located on the top surface of the stage with infrared rays or visible light having a wavelength exceeding 550 nm; and a second irradiation optical system irradiating a second region including the first region on the substrate located on the top surface of the stage with ultraviolet rays and/or visible light having a wavelength of 450 nm or shorter.

In an embodiment, the first irradiation optical system includes an infrared light emitting semiconductor element. The infrared light emitting semiconductor element is, for example, an infrared LED or an infrared laser element.

In an embodiment, the first irradiation optical system further includes a photomask including an infrared-transmissive portion corresponding to the first region.

In an embodiment, the first, irradiation optical system further includes an infrared laser element and a movable mirror for scanning the infrared laser element.

In an embodiment, the second irradiation optical system includes an ultraviolet light source.

In an embodiment, the film formation device further includes an ultraviolet lamp and a photomask including an infrared-transmissive portion corresponding to the first region. The first irradiation optical system includes the ultraviolet lamp and the photomask, and the second irradiation optical system has a structure in which the photomask is retracted from the first irradiation optical system. In an embodiment, the ultraviolet lamp is, for example, a mercury lamp, a mercury-xenon lamp or a metal halide lamp.

In an embodiment, the photomask includes a glass substrate and a cold mirror structure provided on a surface of a region of the glass substrate, the region acting as the infrared-transmissive portion.

In an embodiment, the photomask includes a metal film on a surface of another region of the glass substrate, the other region excluding the region acting as the infrared-transmissive portion, and the metal film has a thickness of 500 nm or greater.

In an embodiment, the photomask includes a cold filter structure on a surface of another region of the glass substrate, the other region excluding the region acting as the infrared-transmissive portion.

In an embodiment, the film formation device may further include a thermoviewer (infrared thermography device) directed toward the top surface of the stage.

The above-described embodiments of the present invention may be combined with the following embodiments.

An organic EL display device according to an embodiment of the present invention includes a flexible substrate; a plurality of TFTs formed on the flexible substrate; a plurality of gate bus lines and a plurality of source bus lines each connected with any one of the plurality of TFTs; a plurality of organic EL elements each connected with any one of the plurality of TFTs; a plurality of terminals located in a peripheral region outer to an active region in which the plurality of organic EL elements are located; a plurality of lead wires each connecting either one of the plurality of terminals and either, one of the plurality of gate bus lines or either one of the plurality of source bus lines; and a thin film encapsulation structure formed on the plurality of organic EL elements and on portions of the plurality of lead wires, the portions being closer to the active region. The thin film encapsulation structure includes a first inorganic barrier layer, an organic barrier layer in contact with the first inorganic barrier layer, and a second inorganic barrier layer in contact with the organic barrier layer. At least a portion of each of the plurality of lead wires includes, at least on a lowermost portion of each of two side surfaces thereof in contact with the first organic barrier layer, a forward tapering side surface portion having a tapering angle smaller than 90 degrees in a cross-section parallel to a line width direction thereof. On the portion of each of the plurality of lead wires that includes the forward tapering side surface portion, the organic barrier layer is not present and the first inorganic barrier and the second inorganic barrier are in direct contact with each other.

In an embodiment, the plurality of terminals each include a forward tapering side surface portion having a tapering angle smaller than 90 degrees at least on a lowermost portion of each of all exposed side surfaces thereof.

In an embodiment, the forward tapering side surface portion has a tapering angle smaller than, or equal to, 85 degrees.

In an embodiment, the forward tapering side surface portion has a length longer than, or equal to, 50 nm in a direction normal to the flexible substrate.

In an embodiment, the portion of each of the plurality of lead wires on which the organic barrier layer is not present and the first inorganic barrier layer and the second inorganic barrier layer are in direct contact with each other has a length of at least 0.01 mm.

In an embodiment, the plurality of gate bus lines and the plurality of source bus lines each have side surfaces each having a tapering angle exceeding 85 degrees in a cross-section parallel to a line width direction thereof.

In an embodiment, the organic barrier layer is not substantially present on a flat portion.

In an embodiment, the organic barrier layer includes an opening on a flat portion, and a portion of the organic barrier layer that is present on the flat portion has an area size larger than an area size of the opening.

In an embodiment, an underlying surface for the organic barrier layer includes a bank substantially enclosing the active region. The bank includes, at least on a lowermost, portion of each of two side surfaces thereof in contact with the first inorganic barrier layer, a forward tapering side surface portion having a tapering angle smaller than 90 degrees in a cross-section parallel to a line width direction thereof. A portion of each of the lead wires that is on the bank includes the forward tapering side surface portion. On the bank, the organic barrier layer is not present and the first inorganic barrier layer and the second inorganic barrier layer are in direct contact with each other.

A method for producing an organic EL display device according to an embodiment of the present invention is a method for producing any of the above-described organic EL display devices. The method includes step A of forming the first inorganic barrier layer selectively on the active region of the flexible substrate, the plurality of organic EL elements being formed in the active region; a step, after the step A, of locating the flexible substrate in a chamber and supplying a vapor-like or mist-like photocurable resin into the chamber; step B of condensing the photocurable resin on the first inorganic barrier layer such that the photocurable resin is not present on the portion of each of the lead wires that includes the forward tapering side surface portion; and a step, after the step B, of irradiating the condensed photocurable resin with light to form the organic barrier layer of the photocurable resin.

A method for producing an organic EL display device according another an embodiment of the present invention is a method for producing any of the above-described organic EL display devices. The method includes step A of forming the first inorganic barrier layer selectively on the active region of the flexible substrate, the plurality of organic EL elements being formed in the active region; a step, after the step A, of locating the flexible substrate in a chamber and supplying a vapor-like or mist-like photocurable resin into the chamber; a step of condensing the photocurable resin on the first inorganic barrier layer to form a liquid film of the photocurable resin; a step of irradiating the liquid film of the photocurable resin with light to form a photocurable resin layer; and a step of partially ashing the photocurable resin layer to form the organic barrier layer.

A method for producing an organic EL display device according to an embodiment further includes a step of forming the plurality of gate bus lines, the plurality of source bus lines, the plurality of lead wires, and the plurality of terminals by a dry etching process.

In an embodiment, the step of forming the plurality of lead wires includes a step of forming the portion including the forward tapering side surface portion by a photolithography step using a multi-gray scale mask.

In an embodiment, the photocurable resin contains a vinyl group-containing monomer. It is preferred that the vinyl group-containing monomer contains an acrylic monomer. The photocurable resin may be a silicone resin.

An organic EL display device according to an embodiment of the present invention includes an organic EL element formed on a flexible substrate and a thin film encapsulation structure formed on the organic EL element. The thin film encapsulation structure includes a first inorganic barrier layer, an organic barrier layer in contact with the first inorganic barrier layer, and a second inorganic barrier in contact with the organic barrier layer. The organic barrier layer is present on at least a part of a flat portion, and a surface of the organic barrier layer is oxidized. Herein, the "flat portion" refers to a flat portion of a surface of the organic EL element on which the thin film encapsulation structure is formed, more specifically, a lowest portion of the portion. It should be noted that a portion in which a particle (microscopic dust particle) is attached to the surface of the organic EL element is excluded.

In an embodiment, the organic barrier layer includes an opening on the flat portion, and the portion of the organic barrier layer that is present on the flat portion has an area size larger than an area size of the opening. Namely, the area size of the portion on the flat portion where the organic barrier layer is present (such a portion may be referred to as a "solid portion") is larger than the area size of the opening. The area size of the solid portion is 50% or greater of the area size of the organic barrier layer (including the solid portion and the opening) on the flat portion, namely, 50% of the area size of the photocurable resin layer on the flat portion. It is preferred that the area size of the solid portion is 80% or greater of the area size of the photocurable resin layer on the flat portion. It is more preferred that the area size of the solid portion is 80% or greater and 90% or less of the area size of the photocurable resin layer on the flat portion. The organic barrier layer on the flat portion does not need to include an opening.

In an embodiment, the organic barrier layer present on the flat portion has a thickness of 10 nm or greater.

In an embodiment, the organic barrier layer present on the flat portion has a maximum thickness less than 200 nm.

In an embodiment, the first inorganic barrier layer and the second inorganic barrier layer are independently an SiN layer having a thickness of 200 nm or greater and 1000 nm or less. The SiN layer has a film stress having an absolute value of preferably 100 MPa or smaller, more preferably, 50 MPa or smaller. It is preferred that the film formation temperature of the SiN layer is 90° C. or lower.

A method for producing an organic EL display device according to an embodiment of the present invention is a method for producing any of the above-described organic EL display devices. The method includes the steps of preparing, in a chamber, an organic EL element having the first inorganic barrier layer formed thereon; supplying a vapor-like or mist-like photocurable resin into the chamber; condensing the photocurable resin on the first inorganic barrier layer to form a liquid film of the photocurable resin; irradiating the liquid film of the photocurable resin with light to form a photocurable resin layer; and partially ashing the photocurable resin layer to form the organic barrier layer.

In an embodiment, the method includes the step of performing ashing such that more than 50% of the photocurable resin layer formed on the flat portion is left. The ashing is performed by plasma ashing using at least one type of gas among $N_2O$, $O_2$ and $O_3$.

Advantageous Effects of Invention

An embodiment of the present invention provides a method for producing an organic EL device that includes a thin film encapsulation structure including a relatively thin organic barrier layer and is improved in the mass-productivity and the moisture-resistance reliability, and a film formation device usable for the method.

BRIEF DESCRIPTION OF DRAWINGS

FIG. 2(a) is a schematic partial cross-sectional view of an active region of an OLED display device 100 according to an embodiment of the present invention, and FIG. 2(b) is a partial cross-sectional view of a TFE structure 10 formed on an OLED 3.

FIG. 4(a) through FIG. 4(e) are each a schematic cross-sectional view of the OLED display device 100A; FIG. 4(a) is a cross-sectional view taken along line 4A-4A' in FIG. 3, FIG. 4(b) is a cross-sectional view taken along line 4B-4B' in FIG. 3, FIG. 4(c) is a cross-sectional view taken along line 4C-4C' in FIG. 3, FIG. 4(d) is a cross-sectional view taken along line 4D-4D' in FIG. 3, and FIG. 4(e) is a cross-sectional view taken along line 4E-4E' in FIG. 3.

FIG. 5(a) is an enlarged view of a portion including a particle P shown in FIG. 4(a), and FIG. 5(b) is a schematic cross-sectional view of a first inorganic barrier layer (SiN layer) covering the particle P.

FIG. 7(a) and FIG. 7(b) are each a schematic view showing a structure of a film formation device 200A usable to form an organic barrier layer 14.

FIG. 8(a) and FIG. 8(b) are respectively schematic views showing structures of film formation devices 200B and 200C usable to form the organic barrier layer 14.

FIG. 9(a) and FIG. 9(b) are each a schematic perspective view showing an example of first region to be irradiated with first light.

FIG. 10(*a*) and FIG. 10(*b*) are each a plan view schematically showing an example of photomask usable to direct the first light.

FIG. 12(*a*) and FIG. 12(*b*) are each a schematic cross-sectional view of the OLED display device 100B; FIG. 12(*a*) is a cross-sectional view taken along line 12A-12A1 in FIG. 11, and FIG. 12(*b*) is a cross-sectional view taken along line 12B-12B' in FIG. 11.

FIG. 13(*a*) and FIG. 13(*b*) are respectively schematic partial cross-sectional views of TFE structures 10C and 10D included in other OLED display devices according to embodiment 1.

FIG. 14(*a*) and FIG. 14(*b*) are each a schematic cross-sectional view showing an example of TFT that may be included in an OLED display device according to embodiment 1.

FIG. 15(*a*) through FIG. 15(*d*) are each a schematic cross-sectional view of another OLED display device according to embodiment 1 and respectively correspond to FIG. 4(*b*) through FIG. 4(*e*).

FIG. 17 includes schematic partial cross-sectional views of a TFE structure 10E in an OLED display device according to embodiment 2 of the present invention; FIG. 17(*a*) is a cross-sectional view of a portion including a particle P, and FIG. 17(*b*) is a cross-sectional view of a portion including a bank 3EB formed on an underlying surface for an organic barrier layer 14E (e.g., surface of the OLED 3) to substantially enclose an active region.

FIG. 20(*a*) through FIG. 20(*c*) are schematic cross-sectional views provided to illustrate a step of forming the organic barrier layer 14E.

FIG. 21(*a*) through FIG. 21(*c*) are schematic cross-sectional views provided to illustrate a step of forming a second inorganic barrier layer 16E.

DESCRIPTION OF EMBODIMENTS

Hereinafter, a method for producing an organic EL device, a film formation method and a film formation device according to embodiments of the present invention will be described with reference to the drawings. The embodiments of the present invention are not limited to the embodiments that are described below as examples.

Figure 1:
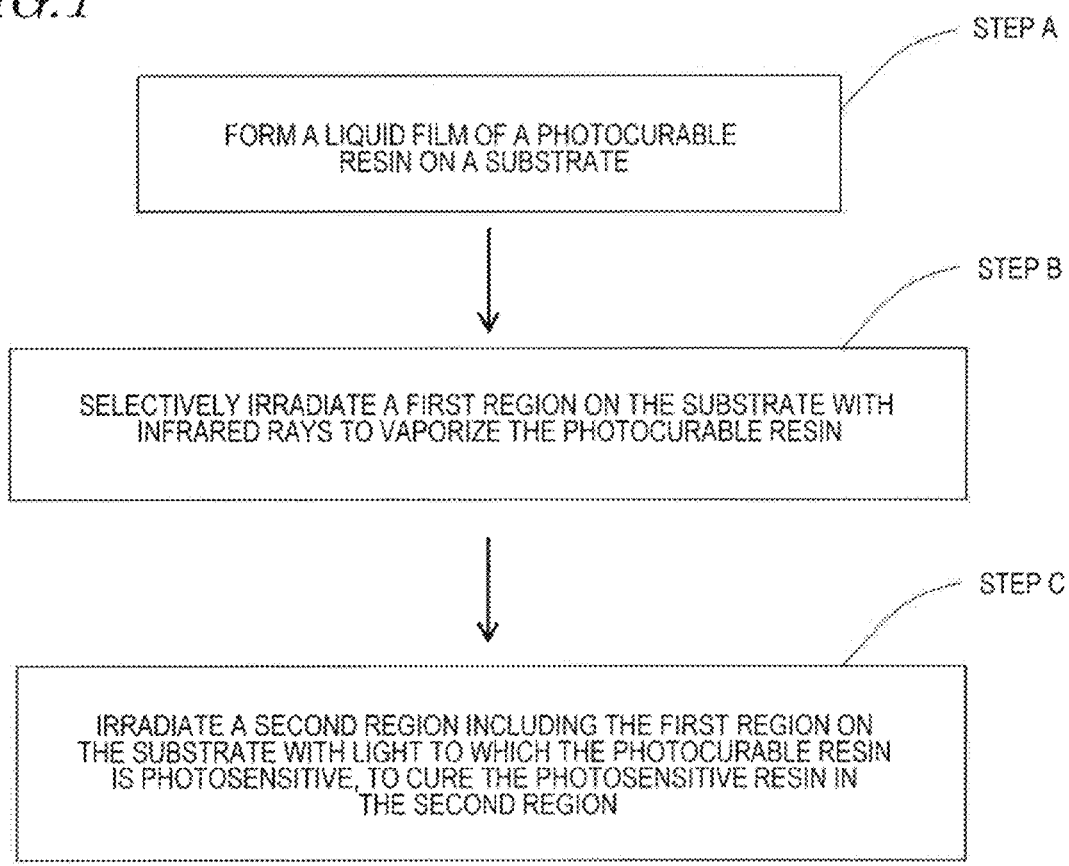
FIG. 1 is a flowchart showing a method for producing an organic EL device according to an embodiment of the present invention.

A film formation method according to an embodiment of the present; invention includes, as shown in FIG. 1, step A of forming a liquid film of a photocurable resin on a substrate, step B of selectively irradiating a first region on the substrate with, for example, infrared rays to vaporize the photocurable resin in the first region, and step C of, after step B, irradiating a second region including the first region on the substrate with light to which the photocurable resin is photosensitive (e.g., ultraviolet rays) to cure the photocurable resin in the second region and thus to form a photocurable resin film (cured resin film). According to this embodiment, the photocurable resin film is formed in a region of the second region on the substrate, the region excluding the first region. The second region may be, for example, the entirety of a surface of the substrate. Namely, according to this embodiment, a specific region is selectively irradiated with infrared rays, so that the photocurable resin film is not formed in the region. As described below, in the case where a light source that emits infrared rays and ultraviolet rays (e.g., ultraviolet lamp) and a photomask including an infrared-transmissive portion (ultraviolet-blocking portion) having a cold mirror structure and an infrared-blocking portion (ultraviolet-transmissive portion) having a cold filter structure are used, step B and step C may be performed concurrently.

Light to irradiate a liquid-state photocurable resin in order to vaporize (evaporate) the photocurable resin is light to heat the photocurable resin. As a wavelength of such light, a wavelength at which a polymerization reaction (curing reaction) of the photocurable resin is not started may be selected from wavelengths of light that is absorbed by the photocurable resin. The wavelength at which a polymerization reaction of the photocurable resin is started (such a wavelength is referred to as a "photosensitive wavelength") may be adjusted by the type of photoinitiator contained in the photocurable resin. An organic compound generally absorbs infrared rays having a wavelength of about 1 μm to about 30 μm (especially, 1 μm to 2 μm). Therefore, infrared rays having a wavelength within a range of about 1 μm to about 30 μm may be used for the irradiation, so that the photocurable resin is effectively heated. The wavelength at which a polymerization reaction of the photocurable resin is started (photosensitive wavelength) may be adjusted by the type of photoinitiator contained in the photocurable resin. In general, a photoinitiator that starts a reaction with visible light (e.g., 400 nm or longer and 500 nm or shorter) or ultraviolet rays is used. Therefore, it is preferred that the wavelength of the visible light used for the irradiation instead of, or together with, the infrared rays exceed 550 nm.

In the following description, infrared rays and/or visible light (wavelength: exceeding 550 nm) to irradiate a liquid-like photocurable resin in order to vaporize the photocurable resin may be referred to as "first light", and ultraviolet rays and/or visible light (e.g., 400 nm or longer and 500 nm or shorter) to irradiate the photocurable resin in order to cure the photocurable resin may be referred to as "second light".

In order to effectively vaporize (evaporate) the liquid-state photocurable resin in the region irradiated with the first light (first region) and thus to expose a surface of an underlying layer (e.g., surface of the substrate), it is preferred that the liquid film of the photocurable resin has a thickness of 500 nm or less. There is no specific lower limit on the thickness of the liquid film. In the case where, for example, the liquid film is used as an organic barrier layer of the above-described thin film encapsulation structure, it is preferred that the liquid film of the photocurable resin has a thickness of 100 nm or greater. The "thickness" of the liquid film of the photocurable resin (or the photocurable resin film) refers to a thickness of a flat portion thereof. The liquid film forms a flat (horizontal) surface. Therefore, in the case where the underlying layer includes a recessed portion, the thickness of the liquid film is increased in such a region. The liquid film forms a curved surface by a surface tension (encompassing a capillary phenomenon). Therefore, the thickness of the liquid film in the vicinity of a protruding portion of the curved surface is increased. Such a locally thick portion may have a thickness exceeding 500 nm.

As a wavelength of the light to irradiate the photocurable resin in step B, a wavelength at which a polymerization reaction of the photocurable resin is not started may be selected. The wavelength at which a polymerization reaction of the photocurable resin is started (photosensitive wavelength) may be adjusted by the type of photoinitiator contained in the photocurable resin. A preferred photocurable resin is an ultraviolet-curable resin from the point of view of the reactivity and the like. The ultraviolet rays to irradiate the photocurable resin are preferably near ultraviolet rays (200 nm or longer and 400 nm or shorter), and are especially preferably near ultraviolet rays in the UV-A region having a wavelength of 315 nm or longer and 400 nm or shorter. Alternatively, ultraviolet rays having a wavelength of 300 nm or longer and shorter than 315 nm may be used. A photocurable resin curable by bluish purple to blue visible light having a wavelength of 400 nm or longer and 450 nm or shorter may be used.

A photocurable resin contains, for example, a vinyl group-containing monomer. Among vinyl group-containing monomers, an acrylic monomer is preferably used. A photoinitiator may be incorporated into the acrylic monomer when necessary. As the acrylic monomer, any of various known acrylic monomers is usable. A plurality of acrylic monomers may be mixed together. For example, a two-functional monomer and a monomer including three or more functional groups may be mixed together. An oligomer may be mixed. As the photocurable resin, an ultraviolet-curable silicone resin may be used. A silicone resin (encompassing silicone rubber) is highly visible light-transmissive and highly resistant against climate, and is not easily yellowed even after being used for a long period of time. A photocurable resin that is cured by being irradiated with visible light may be used. The photocurable resin, before being cured, has a viscosity at room temperature (e.g., 25° C.) that is preferably lower than, or equal to, 10 Pa·s, and is especially preferably 1 to 100 mPa·s. In the case where the viscosity is too high, it may be difficult to form a thin film having a thickness of 500 nm or less.

The liquid film of the photocurable resin is formed, for example, in a chamber accommodating a vapor-like or mist-like photocurable resin, by condensing the vapor-like or mist-like photocurable resin on a substrate. For example, a vapor-like or mist-like acrylic monomer (that may contain a photoinitiator) is supplied into, for example, a chamber having an inner space controlled to have a predetermined pressure (vacuum degree) and a predetermined temperature. The temperature in the chamber may be controlled to be, for example, higher than room temperature, and the temperature of the acrylic monomer may also be controlled to be higher than room temperature. Almost all the acrylic monomer in the chamber may be vapor (gas). Before being supplied into the chamber, a liquid-state acrylic monomer may be made vapor-like or mist-like in a vaporizing container (see, for example, container 202 in FIG. 7).

The substrate is adjusted to have, for example, a temperature lower than room temperature. The vapor of the acrylic monomer is condensed to be a liquid on a top surface of the substrate. In the case where the acrylic monomer is supplied in a sufficiently large amount, a liquid film of the acrylic monomer that covers the entirety of the top surface of the substrate is formed.

A selected region (first region) on the substrate having the liquid film of the photocurable resin formed thereon is irradiated with infrared rays and/or visible light (wavelength: exceeding 550 nm) to vaporize (evaporate) the liquid-state photocurable resin in the irradiated region (first region). The photocurable resin, which has been cooled and thus condensed on the top surface of the substrate, is vaporized by being slightly heated, and thus a surface of the first region on the substrate is exposed. After the photocurable resin in the first region on the substrate is vaporized, the substrate is irradiated with light having a photosensitive wavelength for the photocurable resin (e.g., ultraviolet rays). As a result, a photocurable resin film including an opening or cut-off portion (i.e., portion where the resin is not present) in the first region is obtained.

The above-described film formation method according to an embodiment of the present invention is preferably usable for a method for producing an organic EL device that includes a thin film encapsulation structure including a relatively thin organic barrier and is improved in the mass-productivity and the moisture-resistance reliability. Hereinafter, a method for producing an organic EL device and a film formation device usable for the method according to an embodiment of the present invention will be described by way of an example of method for producing an OLED display device.

First, with reference to FIG. 2(a) and FIG. 2(b), a basic structure of an OLED display device 100 according to an embodiment of the present invention will be described. FIG. 2(a) is a schematic partial cross-sectional view of an active region of the OLED display device 100 according to an embodiment of the present invention. FIG. 2(b) is a partial cross-sectional view of a TFE structure 10 formed on an OLED 3. An OLED display device in each of embodiment 1 and embodiment 2 described below basically has the same structure, and specifically may have the same structure as that of the OLED display device 100 except for the TFE structure.

The OLED display device 100 includes a plurality of pixels, and each of the pixels includes at least one organic EL element (OLED). Herein, a structure corresponding to one OLED will be described for the sake of simplicity.

As shown in FIG. 2(a), the OLED display device 100 includes a flexible substrate (hereinafter, may be referred to simply as a "substrate") 1, a circuit 2 formed on the substrate 1 and including a TFT (this circuit, may be referred to as a "driving circuit" or a "backplane"), the OLED 3 formed on the circuit 2, arid the TFE structure 10 formed on the OLED 3. The OLED 3 is, for example, of a top emission type. An uppermost portion of the OLED 3 is, for example, a top electrode or a cap layer (refractive index adjusting layer). An optional polarizing plate 4 is located on the TFE structure 10.

The substrate 1 is, for example, a polyimide film having a thickness of 15 µm. The circuit 2 including the TFT has a thickness of, for example, 4 µm. The OLED 3 has a thickness of, for example, 1 µm. The TFE structure 10 has a thickness of, for example, less than, or equal to, 1.5 µm.

FIG. 2(b) is a partial cross-sectional view of the TFE structure 10 formed on the OLED 3. A first; inorganic barrier layer (e.g., SiN layer) 12 is formed immediately on the OLED 3, an organic barrier layer (e.g., acrylic resin layer) 14 is formed on the first inorganic barrier layer 12, and a second inorganic barrier layer (e.g., SiN layer) 16 is formed on the organic barrier layer 14.

For example, the first inorganic barrier layer 12 and the second inorganic barrier layer 16 are each an SiN layer having a thickness of for example, 400 nm, and the organic barrier layer 14 is an acrylic resin layer having a thickness less than 100 nm. The thicknesses of the first inorganic barrier layer 14 and the second inorganic barrier layer 16 are each independently 200 nm or greater and 1000 nm or less, and the thickness of the organic barrier layer 14 is 50 nm or greater and less than 200 nm. The TFE structure 10 has a thickness of, preferably, 400 nm or greater and less than 2 µm, and more preferably, 400 nm or greater and less than 1.5 µm.

The TFE structure 10 is formed to protect the active region (see an active region R1 in FIG. 35 of the OLED display device 100. As described above, the TFE structure 10 includes the first inorganic barrier layer 12, the organic barrier layer 14 and the second inorganic barrier layer 16 provided in this order on at least the active region, with the first inorganic barrier layer 12 being closest to the OLED 3. The organic barrier layer 14 is not present as a film covering the entirety of the active region, but includes an opening. A portion of the organic barrier layer 14, more specifically, a portion where the organic film is actually present, namely, a portion excluding the opening, will be referred to as a "solid portion". The opening (may also be referred to as a "non-solid portion") does not need to be enclosed by the solid portion and includes a cut-out portion or the like. In the opening, the first inorganic barrier layer 12 and the second inorganic barrier layer 16 are in direct contact with each other. The opening of the organic barrier layer 14 includes at least an opening formed to enclose the active region, and the active region is completely enclosed by the portion in which the first inorganic barrier layer 12 and the second inorganic barrier layer 16 are in direct contact with each other (hereinafter, such a portion will be referred to as an "inorganic barrier layer joint portion"). An outer shape of the TFE structure 10 is defined by the first inorganic barrier layer 12 and the second inorganic barrier layer 16.

EMBODIMENT 1

Figure 3:
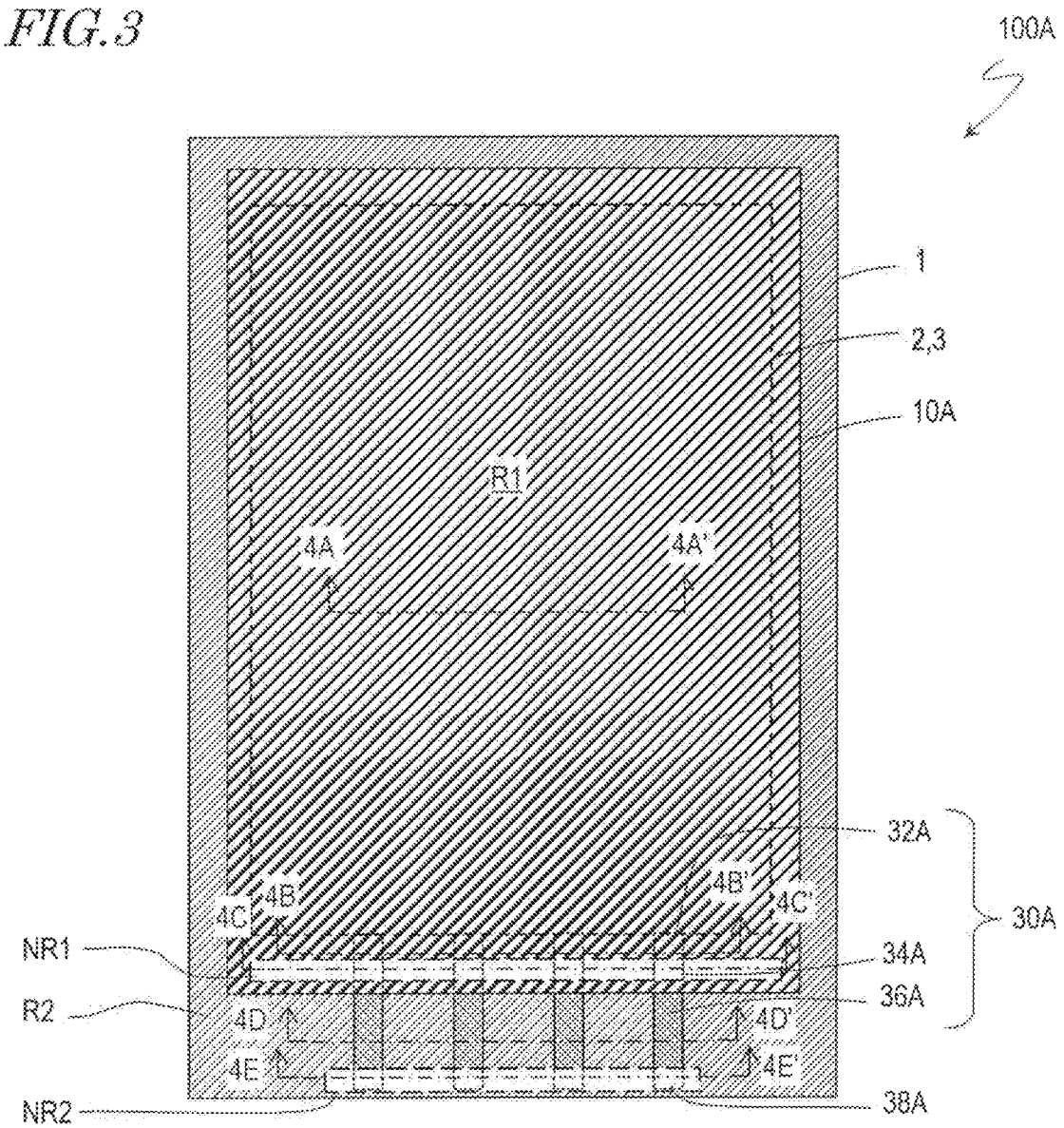
FIG. 3 is a plan view schematically showing a structure of an OLED display device 100A according to embodiment 1 of the present invention.

With reference to FIG. 3 through FIG. 5, an OLED display device and a method for producing the same according to embodiment 1 of the present invention will be described.

FIG. 3 is a schematic plan view of an OLED display device 100A according to embodiment 1 of the present invention.

The OLED display device 100A includes the flexible substrate 1, the circuit ("driving circuit" or "backplane") 2 formed on the substrate 1, a plurality of the OLEDs 3 formed on the circuit 2, and a TFE structure 10A formed on the OLEDs 3. A layer including the plurality of OLEDs 3 may be referred to as an "OLED layer 3". The circuit 2 and the OLED layer 3 may share a part of components. The optional polarizing plate (see reference sign 4 in FIG. 2) may further be located on the TFE structure 10A. In addition, for example, a layer having a touch panel function may be located between the TFE structure 10A and the polarizing plate. Namely, the OLED display device 100A may be altered to a display device including an on-cell type touch panel.

The circuit 2 includes a plurality of TFTs (not shown), and a plurality of gate bus lines (not shown) and a plurality of source bus lines (not shown) each connected to either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100A further includes a plurality of terminals 38A located in a peripheral region R2 outer to the active region (region enclosed by the dashed line in FIG. 3), where the plurality of OLEDs 3 are located, and also includes a plurality of lead wires 30A each connecting either one of the plurality of terminals 38A and either one of the plurality of gate bus lines or either one of the plurality of source bus lines to each other. The TFE structure 10A is formed on the plurality of OLEDs 3 and on portions of the plurality of lead wires 30A, the portions being closer to the active region R1. Namely, the TFE structure 10A covers the entirety of the active region R1 and is also selectively formed on the portions of the plurality of lead wires 30A that are closer to the active region R1. Neither portions of the plurality of lead wires 30A that are closer to the terminals 38A, nor the terminals 38A, are covered with the TFE structure 10A.

In FIG. 3, a region NR1 and a region NR2 are regions irradiated with the first light (e.g., infrared rays) to vaporize the photocurable resin in the step of forming the organic barrier layer 14 before the photocurable resin is cured. Namely, the solid portion of the organic barrier-layer 14 (portion where the organic film is present) is not present in the region NR1 or the region NR2.

Hereinafter, an example in which the lead wires 30A and the terminals 38A are integrally formed of the same conductive layer will be described. Alternatively, the lead wires 30A and the terminals 38A may be formed of different conductive layers (encompassing stack structures).

Now, with reference to FIG. 4(a) through FIG. 4(e), the TFE structure 10A of the OLED display device 100A will be described. FIG. 4(a) is a cross-sectional view taken along line 4A-4A' in FIG. 3. FIG. 4(b) is a cross-sectional view taken along line 4B-4B1 in FIG. 3. FIG. 4(c) is a cross-sectional view taken along line 4C-4C' in FIG. 3. FIG. 4(d) is a cross-sectional view taken along line 4D-4D' in FIG. 3. FIG. 4(e) is a cross-sectional view taken along line 4E-4E' in FIG. 3. FIG. 4(d) and FIG. 4(e) are cross-sectional views of a region where the TFE structure 10A is not formed, but are provided because an organic barrier layer 14A may extend to a region where the terminals 38A are formed (terminal region).

As shown in FIG. 4(a) through FIG. 4(c), the TFE structure 10A includes a first inorganic barrier layer 12A formed on the OLED 3, the organic barrier layer 14A in contact with the first inorganic barrier layer 12A, and a second inorganic barrier layer 16A in contact with the organic barrier layer 14A. The first inorganic barrier layer 12A and the second inorganic barrier layer 16A are each, for example, an SiN layer, and are selectively formed only in a predetermined region by plasma CVD by use of a mask so as to cover the active region R1. In this example, the first inorganic barrier layer 12A and the second inorganic barrier layer 16A are independently and selectively formed on the active region R1 and portions of the plurality of lead wires 30A closer to the active region R1. From the point of view of reliability, it is preferred that the second inorganic barrier layer 16A is formed in the same region as that of the first inorganic barrier layer 12A (the second inorganic barrier layer 16A and the first inorganic barrier layer 12A have matching outer edges) or is formed so as to cover the entirety of the first inorganic barrier layer 12A.

FIG. 4(a) is a cross-sectional view taken along line 4A'4A' in FIG. 3, and shows a portion including a particle P. The particle P is a microscopic dust particle generated during the production of the OLED display device, and is, for example, a microscopic piece of broken glass, a metal particle or an organic particle. Such a particle is generated especially easily in the case where mask vapor deposition is used.

As shown in FIG. 4(a), the organic barrier layer (solid portion) 14A may be formed only in the vicinity of the particle P. A reason for this Is that the acrylic monomer supplied after the first inorganic barrier layer 12A is formed is condensed and present locally, more specifically, in the vicinity of a surface of a first inorganic barrier layer 12Aa on the particle P (the surface has a tapering angle that is, for example, larger than 90 degrees). The organic barrier layer 14A includes the opening (non-solid portion) on a flat portion of the first inorganic barrier layer 12A.

Now, with reference to FIG. 5(a) and FIG. 5(b), a structure of a portion including the particle P will be described. FIG. 5(a) is an enlarged view of the portion including the particle P shown in FIG. 4(a). FIG. 5(b) is a schematic cross-sectional view of the first inorganic barrier layer (e.g., SiN layer) covering the particle P.

Referring to FIG. 5(b), in the case where the particle P (having a diameter, for example, longer than, or equal to, 1 μm) is present, a crack (defect) 12Ac may be formed in the first inorganic barrier layer. As described below, this is considered to be caused by impingement of the SiN layer 12Aa growing from a surface of the particle P and an SiN layer 12Ab growing from a flat portion of a surface of the OLED 3. In the case where such a crack 12Ac is present, the level of barrier property of the TFE structure 10A is decreased.

In the TFE structure 10A in the OLED display device 100a, as shown in FIG. 5(a), the organic barrier layer 14A is formed to fill the crack 12Ac of the first inorganic barrier layer 12A, and a surface of the organic barrier layer 14A couples a surface of the first inorganic barrier layer 12Aa on the particle P and a surface of the first inorganic barrier layer 12Ab on the flat portion of the OLED 3 to each other continuously and smoothly. Therefore, the second inorganic barrier layer 16A formed on the first inorganic barrier layer 12A on the particle P and on the organic barrier layer 14A has no defect formed therein and is formed as a fine film. As can be seen, even if there is the particle P, the organic barrier layer 14A keeps high the level of barrier property of the TFE structure 10A.

It is preferred that the organic barrier layer 14A is formed of, for example, an acrylic resin. It is especially preferred that the organic barrier layer 14A is formed by curing an acrylic monomer (acrylate) having a viscosity of about 1 to about 100 mPa·s at room temperature (e.g., 25° C.) by light (e.g., ultraviolet rays). An acrylic monomer having such a low viscosity may easily permeate the crack 12Ac and a portion of the first inorganic barrier layer 12A, the portion being overhung by the particle P. The acrylic resin has a high visible light transmittance and thus is preferably usable for a top emission-type OLED display device. Alternatively, the organic barrier layer 14A may be formed of any of the photocurable resins described above.

Now, with reference to FIG. 4(b) and FIG. 4(c), a structure of the TFE structure 10A on the lead wires 30A will be described. FIG. 4(b) is a cross-sectional view taken along line 4B-4B' in FIG. 3, more specifically, is a cross-sectional view of portions 32A of the lead wires 30, the portions 32A being closer to the active region R1. FIG. 4(c) is a cross-sectional view taken along line 4C-4C' in FIG. 3, more specifically, is a cross-sectional view of portions 34A present in the region NR1.

The lead wires 30A are patterned by the same step as that of, for example, the gate bus lines or the source bus lines. Thus, in the example described below, the gate bus lines and the source bus lines formed in the active region R1 also have the same cross-sectional structure as that of the portions 32A of the lead wires 30a closer to the active region R1 shown in FIG. 4(b).

The OLED display device 100A according to an embodiment of the present invention is preferably usable for, for example, medium- to small-sized high-definition smartphones and tablet terminals. In a medium- to small-sized (e.g., 5.7-type) high-definition (e.g., 500 ppi) OLED display device, it is preferred that the lines (encompassing the gate bus lines and the source bus lines) in the active region R1 have a cross-sectional shape, in a direction parallel to a line width direction thereof, close to a rectangle (side surfaces of the lines have a tapering angle of about 90 degrees) in order to allow the lines to have a sufficiently low resistance with a limited line width. The active region R1 of the OLED display device 100A is substantially enclosed by the inorganic barrier layer joint portion, in which the first inorganic barrier layer 12A and the second inorganic barrier layer 16A are in direct contact with each other. Therefore, it does not occur that the organic barrier layer 14A acts as a moisture entrance route allowing the moisture to reach the active region R1 of the OLED display device. The inorganic barrier layer joint portion is formed on a portion of each of the lead wires 30A, the portion being in the region NR1.

The OLED display device 100A is, for example, a medium- or small-sized high-definition display device, and the side surfaces of the gate bus lines and the source bus lines have a tapering angle of about 90 degrees in a cross-section parallel to the line width direction. The side surfaces of the portion 32A of the lead wire 30A closer to the active region R1 have a tapering angle of about 90 degrees in a cross-section parallel to the line width direction, like the gate bus lines or the source bus lines. The organic barrier layer (solid portion) 14A is formed on a lowermost portion of the first inorganic barrier layer 12A covering the portion 32A of the lead wire 30A (at the border between the portion covering each side surface of the lead wire 30A and the portion formed on a flat portion of the substrate 1). A reason for this is that a liquid-state photocurable resin (e.g., acrylic monomer) is located locally, more specifically, in a portion, of the first inorganic barrier layer 12A, the portion having a surface forming an angle larger than, or equal to, 90 degrees.

By contrast, referring to FIG. 4(c), the portion 34A of the lead wire 30A is formed in the region NR1. Since the liquid-state photocurable resin condensed in a lowermost portion of the first inorganic barrier layer 12A covering the portion 34A of the lead wire 30A is vaporized by being irradiated with the first light (e.g., infrared rays), no photocurable resin (solid portion of the organic barrier layer 14A) is formed in the region NR1. As a result, in the cross-section taken along line 4C-4C' in FIG. 3, the lead wire 30A is covered with the inorganic barrier layer joint portion, in which the first inorganic barrier layer 12A and the second inorganic barrier layer 16A are in direct contact with each other Therefore, as described above, it does not occur that the organic barrier layer formed along the lead wire acts as a route that guides the water vapor in the air into the active region. From the point of view of the moisture-resistance reliability, it is preferred that the length of the portion 34A of the lead wire 30A, namely, the length of the inorganic barrier layer joint portion, is at least 0.01 mm. There is no specific upper limit on the length of the inorganic barrier layer joint portion. Even if the length of the inorganic barrier layer joint portion exceeds 0.1 mm, the effect of improving the level of moisture-resistance reliability is substantially saturated, and rather, merely increases the width of a frame portion. Therefore, the length of the inorganic barrier layer joint portion is preferably shorter than, or equal to, 0.1 mm, and may be, for example, shorter than, or equal to, 0.05 mm. The conventional TFE structure in which the organic barrier layer is formed by the inkjet method includes an inorganic barrier layer joint portion having a length of about 0.5 mm to about 1.0 mm in consideration of the variance in the position at which an end of the organic barrier layer is located. By contrast, according to an embodiment of the present invention, the length of the inorganic barrier layer joint portion may be shorter than, or equal to, 0.1 mm. This decreases the width of the frame portion of the organic EL display device.

Now, FIG. 4(*d*) and FIG. 4(*e*) will be referred to. FIG. 4(*d*) and FIG. 4(*e*) are cross-sectional views of the region where the TFE structure 10A is not formed. Portions 36A of the lead wires 30A shown in FIG. 4(*d*) have substantially the same cross-sectional shape as that of the portions 32A of the lead wires 30A shown in FIG. 4(*b*). On a lowermost portion of each oi side surfaces of the portion 36A, the organic barrier layer 14A is formed. By contrast, the terminals 38A shown in FIG. 4(*e*) are formed in the region NR2. Therefore, the organic barrier layer (solid portion) 14A is not present on side surfaces of the terminals 38A, like the portions 34A of the lead wires 30A shown in FIG. 4(*c*). The organic barrier layer (solid portion) 14A is not present either on the flat portion.

As described above, the organic barrier layer 14A is formed by a method including a step of supplying a vapor-like or mist-like photocurable resin (e.g., acrylic monomer), and therefore, cannot be selectively formed only in a predetermined region, unlike the first inorganic barrier layer 12A or the second inorganic barrier layer 16A. Therefore, the organic barrier layer (solid portion) 14A may be undesirably formed also on the terminals 38*a*. This requires the organic barrier layer 14A (solid portion) on the terminals 38A to be removed, which decreases the mass-productivity. Irradiation of the region NR2 including the terminals 38A with the first light suppresses the formation of the organic barrier layer (solid portion) 14A on the side surfaces and top surfaces of the terminals 38A.

Figure 6:
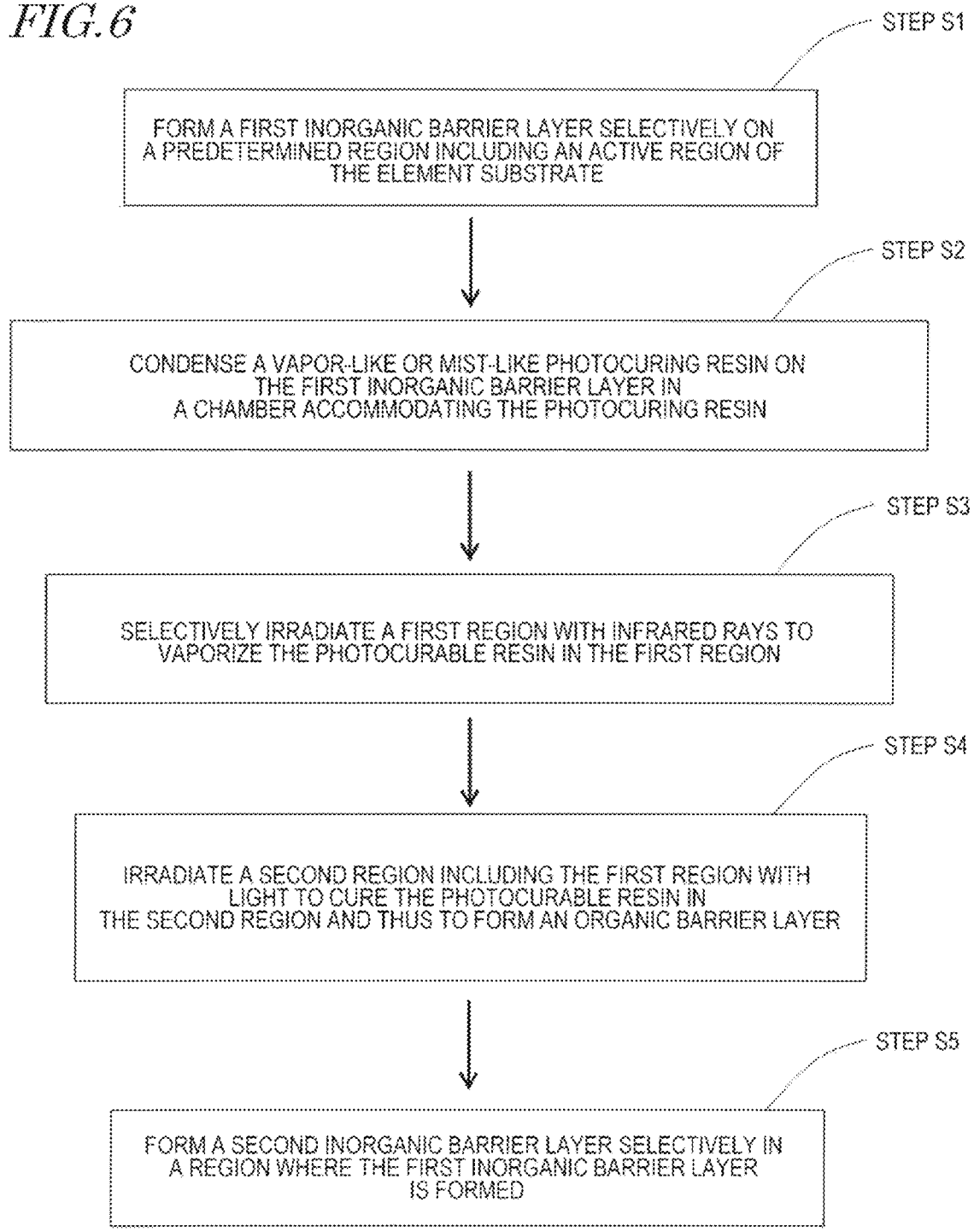
FIG. 6 is a flowchart showing a method for forming a TFE structure 10A in a method for producing an OLED display device 100A according to an embodiment of the present invention.

With reference to FIG. 6, a method for forming the TFE structure 10A will be described.

As shown in FIG. 6, the method for forming the TFE structure 10A includes step SI of forming a first inorganic barrier layer selectively in a predetermined region including the active region on an element substrate, step S2 of condensing a vapor-like or mist-like photocurable resin on the first inorganic barrier layer 12A in a chamber accommodating the photocurable resin, step S3 of selectively irradiating a first region with infrared rays to vaporize the photocurable resin in the first region, step S4 of irradiating a second region including the first region with light to cure the photocurable resin in the second region, and thus to form the organic barrier layer 14A, and step S5 of forming the second inorganic barrier layer 16A selectively in a region where the first inorganic barrier layer 12A is formed.

The predetermined region in step S1 is, for example, the active region R1 and portions of the plurality of lead wires 30A, the portions being closer to the active region R1.

Step S2 is a step of, for example, locating the liquid-state photocurable resin locally, more specifically, only in the vicinity of a protruding portion included in the first inorganic barrier layer 12A. Namely, the liquid-state photocurable resin is located locally, more specifically, only in the vicinity of a portion, of the first inorganic barrier layer 12A, formed on the lead wires 30A and/or the particle P (protruding portion included in the first inorganic barrier layer 12A). In embodiment 2 described below, in step S2, a liquid film of the photocurable resin may be formed on the entirety of the surface, of the element substrate, including the first inorganic barrier layer, in addition to in the vicinity of the protruding portion included in the first inorganic barrier layer.

In step S3, the photocurable resin in the first region is selectively vaporized. The first region includes a dividing region crossing the plurality of lead wires 30A. The dividing region crossing the plurality of lead wires 30A is, for example, one linear region crossing the plurality of lead wires 30A, like the region NR1 shown in FIG. 3. The first; region is not limited to having such a shape. For example, the first region may include a plurality of regions. For example, the plurality of regions may each be formed to cross one, or at least two, of the lead wires 30A. Herein, the expression "crossing the lead wires 30A" refers to continuously overlapping a top surface (upper surface) and two side surfaces located on two sides of the top surface of each of the lead wires 30A. The dividing region crossing the lead wires 30A does not need to be linear. For example, the region NR1 represented by the solid line in FIG. 3 may be replaced with a plurality of island-like regions located to form a dotted line.

The first region may include, for example, the region NR2 shown in FIG. 3. The region NR2 is one linear region including the plurality of terminals 38A, but is not limited to having such a shape. A plurality of the regions NR2 may each include one or at least two terminals 38A.

Alternatively, the first region may be one continuous region including the region NR1 and the region NR2 shown in FIG. 3.

The light to irradiate the liquid-state photocurable resin in order to vaporize (evaporate) the photocurable resin in step S3 is preferably infrared rays and/or visible light (wavelength: exceeding 550 nm) as described above. The light to irradiate the photocurable resin in order to cure the photocurable resin in step S4 is light to which the photocurable resin is photosensitive, and is preferably ultraviolet rays and/or visible light (having a wavelength of, for example, 400 nm or longer and 500 nm or shorter). The second region to be irradiated in step S4 is, for example, the entirety of the surface of the element substrate. As a result of step S4, the organic barrier layer formed of the photocurable resin is formed. This organic barrier layer does not contain the photocurable resin in the first region.

After stop S4, the second inorganic barrier layer 16A is selectively formed in the region where the first inorganic barrier layer 12A is formed. As a result, the TFE structure including the inorganic barrier layer joint portion, in which the first inorganic barrier layer 12A and the second inorganic barrier layer 16A are in direct contact with each other, in the first region is obtained. The inorganic barrier layer joint portion may be formed at least in the dividing region of the first region crossing the plurality of lead wires 30A. For example, the TFE structure 10A shown in FIG. 3 includes the inorganic barrier layer joint; portion in the region NR1. In the region NR2 of the TFE structure 10A, the plurality of terminals 38A are exposed.

Now, with reference to FIG. 7(a) and FIG. 7(b), a film formation device 200A usable to form the organic barrier-layer 14A and a film formation method using the same will be described. FIG. 7(a) and FIG. 7(b) schematically show a structure of the film formation device 200A. FIG. 7(a) shows a state of the film formation device 200A in step S2 described above and also in step S3 performed after step S2. FIG. 7(b) shows a state of the film formation device 200A in step S4 described above.

The film formation device 200A includes a chamber 210 and a partition wall 234 dividing an inner space of the chamber 210 into two spaces. In one of the spaces, in the chamber 210, demarcated by the partition wall 234, a stage 212 and a shower plate 220 are located. In the other space demarcated by the partition wall 234, an ultraviolet irradiation device 230U and an infrared irradiation device 230R are located. The inner space of the chamber 210 is controlled to have a predetermined pressure (vacuum degree) and a predetermined temperature. The stage 212 has a top surface that receives the element substrate 20 including the plurality of the OLEDs 3, on which the first inorganic barrier layer is formed. The top surface may be cooled down to, for example, −20° C.

The shower plate 220 is located to have a gap 224 between the shower plate 220 and the partition wall 234. The shower plate 220 includes a plurality of through-holes 222. The gap 224 may have a size of, for example, 100 trim or longer and 1000 mm or shorter in a vertical direction. An acrylic monomer (vapor-like or mist-like) supplied to the gap 224 is supplied, via the plurality of through-holes 222 of the shower plate 220, to one of the spaces of the chamber 210 in which the stage 212 is located. When necessary, the acrylic monomer is heated. A vapor-like or mist-like acrylic monomer 26p is attached to, or contacts, the first, inorganic barrier layer on the element substrate 20. An acrylic monomer 26 is supplied from the container 202 into the chamber 210 at a predetermined flow rate. The container 202 is supplied with the acrylic monomer 26 via a pipe 206 and is also supplied with nitrogen gas from a pipe 204. The flow rate of the acrylic monomer supplied to the container 202 is controlled by a mass flow controller 208. A material supply device includes the shower plate 220, the container 202, the pipes 204 and 206, the mass flow controller 208 and the like.

The ultraviolet irradiation device 230U includes an ultraviolet light source and an optional optical element. The ultraviolet light source may be, for example, an ultraviolet lamp (e.g., mercury lamp (encompassing a high-pressure lamp and a super-high pressure lamp), a mercury-xenon lamp or a metal halide lamp). Alternatively, the ultraviolet light source may be an ultraviolet light emitting semiconductor element such as an ultraviolet LED, an ultraviolet semiconductor laser or the like. The optical element encompasses, for example, a reflective mirror, a prism, a lens, an optical fiber, a diffractive element, a spatial modulation element, and a hologram. A beam that is output from, for example, an ultraviolet laser is shaped by use of any of various known optical elements. For example, a beam having a linear cross-sectional shape may be formed. A plurality of ultraviolet light sources may be used in the case where the ultraviolet light sources are of a certain type or a certain size. For example, a plurality of semiconductor lasers may be located in one line or in a two-dimensional array. One, or two or more, laser beams may be used for scanning.

The infrared irradiation device 230R includes an infrared light source and an optional optical element. The infrared light source may preferably be, for example, an infrared light emitting semi-conductor element such as an infrared LED, an infrared semiconductor laser or the like. In order to be vaporized (evaporated) on the element substrate cooled to, for example, −20° C., the liquid-state photocurable resin may be, for example, raised in the temperature to 0° C. or higher. Namely, the temperature of the liquid-state photocurable resin on the element substrate may be raised by 20° C. or more, preferably by 30° C. to 50° C. or more. The amount of heat that is necessary to raise the temperature of the liquid-state photocurable resin (thickness: e.g., 100 nm or greater) on the element substrate by 20° C. or more may be, for example, about 1 mJ/cm$^2$ to about 10 mJ/cm$^2$. Therefore, for example, a semiconductor laser for communication (e.g., 1.3 μm band and/or 1.55 μm band; output: greater than 250 mW) is usable. It is not necessary to use a large-output infrared light source such as an infrared lamp (e.g., halogen lamp) or the like.

A beam that is output from the infrared semiconductor laser element is shaped by use of any of various known optical elements. For example, a beam having a linear cross-sectional shape may be formed. A plurality of semiconductor lasers may be used. For example, the plurality of semiconductor lasers may be located in one line or in a two-dimensional array. One, or two or more, laser beams may be directed concurrently; or, one, or two or more, laser beams may be used for scanning. A beam having a rectangular (e.g., 0.05 ironx100 mm) cross-section may be formed and used for step-scanning. These arrangements may be appropriately changed in accordance with the size, positional arrangement or the like of the region (first region) to be irradiated.

The ultraviolet irradiation device 230U and the infrared irradiation device 230R are configured to be switchable to each other. The ultraviolet irradiation device 230U and the infrared irradiation device 230R each emit light having a predetermined wavelength and a predetermined intensity toward the top surface of the stage 212 when located at a predetermined position. It is preferred that the partition wall 234 and the shower plate 220 are formed of a material having a high transmittance to ultraviolet rays and infrared rays, for example, quartz.

The organic barrier layer 14A may be formed, for example, as follows by use of the film formation device 200A.

The acrylic monomer 26p is supplied into the chamber 210. The element substrate 20 has been cooled to, for example, −15° C. on the stage 212. The acrylic monomer 26p is condensed on the first inorganic barrier layer 12A on the element substrate 20. The conditions in this step may be controlled such that the liquid-state acrylic monomer is present locally, more specifically, only in the vicinity of the protruding portion of the first inorganic barrier layer 12A.

Then, the gas in the chamber 210 is discharged to remove and the vapor-like or mist-like acrylic monomer 26p. After this, the infrared irradiation device 230R is used to selectively irradiate a predetermined region (the first region: the region NR1 and region NR2 in FIG. 3) with infrared rays 232R, so that the acrylic monomer in the region irradiated with the infrared rays 232R is vaporized (evaporated). As a result, the surface of the first inorganic barrier layer 12A in the first region is exposed. Namely, the liquid-state photocurable resin located locally, more specifically, in the vicinity of the protruding portion of the inorganic barrier layer 12A in the first region (e.g., portion formed on the lead wires 30A) is vaporized, and thus the surface of the inorganic barrier layer 12A in the first region is exposed.

Next, the ultraviolet irradiation device 230U is used to irradiate the second region including the first region (typically, the entirety of the top surface of the element substrate 20) with ultraviolet rays 232U to cure the acrylic monomer on the first inorganic barrier layer 12A. As the ultraviolet light source, for example, a high-pressure mercury lamp that provides light having a main peak wavelength of 365 nm is used. The ultraviolet rays are directed at an intensity of, for example, 12 raw/cm$^2$ for about 10 seconds.

As a result, the organic barrier layer 14A formed of the acrylic resin is formed. The organic barrier layer 14A does not contain the acrylic resin in the first region (region NR1 and region NR2). The tact time of the step of forming the organic barrier layer 14A is shorter than, for example, about 30 seconds. Thus, the mass-productivity is very high.

After the above, the resultant assembly of layers is transported to a CVD chamber in order to form the second inorganic barrier layer 16A. The second inorganic barrier layer 16A is formed under, for example, the same conditions as for the first inorganic barrier layer 12A. The second inorganic barrier layer 16A is formed in the region where the first inorganic barrier layer 12A is formed. Therefore, the inorganic barrier layer joint portion, where the first inorganic barrier layer 12a and the second inorganic barrier layer 16A are in direct contact with each other, is formed in the region NR1 in the first region. Therefore, as described above, it does not occur that the organic barrier layer formed along the lead wires acts as a route that guides the water vapor in the air into the active region.

The first inorganic barrier layer 12A and the second inorganic barrier layer 16A are each formed, for example, as follows. Such an inorganic barrier layer having a thickness of 400 nm may be formed by plasma CVD using SiH$_4$ gas and N$_2$O gas, at a film formation rate of 400 nm/min, in a state where, for example, the temperature of the substrate (the OLED 3) on which the film is to be formed is controlled to be lower than, or equal to, 80° C. The inorganic barrier layer thus obtained has a refractive index of 1.84 and a 400 nm visible light transmittance of 90% (thickness: 400 nm). The inorganic barrier layer has a film stress having an absolute value of 50 MPa.

The inorganic barrier layer may be an SiC layer, an SiON layer, an SiNO layer, an Al$_2$O$_3$ layer or the like as well as an SiN layer. The resin usable to form the organic barrier layer may be, for example, a photocurable resin such as a vinyl group-containing monomer or the like as well as the acrylic resin. An ultraviolet-curable silicone resin may be used as the photocurable resin.

A film formation device 200B or 200C shown in FIG. 8(*a*) or FIG. 8(*b*) may be used instead of the film formation device 200A.

In the film formation device 200B shown in FIG. 8(*a*), the infrared irradiation device 230R is located below the stage 212. The stage 212 is formed of, for example, glass, which transmits infrared rays. The infrared irradiation device 230R emits the infrared rays 232R toward a bottom surface of the stage 212.

A light irradiation device 230 included in the film formation device 200C shown in FIG. 8(*b*) includes, for example, an ultraviolet lamp as an ultraviolet light source, and emits ultraviolet rays and infrared rays. The film formation device 200C further includes a photomask 52 located close to the surface of the element substrate 20, which is located on the top surface of the stage 212. The photomask 52 is provided so as to be retractable from an optical path between the light irradiation device 230 and the element substrate 20.

The photomask 52 includes an infrared-transmissive portion corresponding to the first region, and thus the first region may be selectively irradiated with infrared rays. The acrylic monomer in the first region is vaporized in a state where the photomask 52 is located at a predetermined position, and then the photomask 52 is retracted. In this manner, the entirety of the top surface of the element substrate 20 is irradiated with ultraviolet rays.

Herein, an optical system irradiating the element substrate 20 with infrared rays (first light) is referred to as a "first irradiation optical system", and an optical system irradiating the element substrate 20 with ultraviolet rays (second light) is referred to as a "second irradiation optical system". In the film formation device 200C, the first irradiation optical system includes the ultraviolet lamp and the photomask, and the second irradiation optical system has a structure in which the photomask 52 is retracted from the first irradiation optical system.

The photomask 52 may include a substrate having a high transmittance to infrared rays (e.g., glass substrate), a cold mirror structure provided on a surface of a region of the substrate, the region acting as an infrared-transmissive portion, and a metal film provided on a surface of the remaining region of the substrate. The cold mirror structure includes a multi-layer dielectric film, and selectively transmits infrared rays (e.g., about 800 nm or longer and about 2000 nm or shorter) and reflects visible light and ultraviolet rays. The metal film may be formed of, for example, a Cr film (chromium film) having a thickness of 500 nm or greater. It is preferred that the metal film (e.g., Cr film) has a thickness of 1 μm or greater in order to have a sufficiently high light blocking property. There is no specific upper limit on the thickness of the metal film. A thickness of, for example, 3 μm or greater does not provide any difference in the light blocking property.

A cold filter structure may be provided instead of the metal film. The cold filter structure includes a multi-layer dielectric film, and unlike the cold mirror structure, reflects infrared rays and transmits visible light and ultraviolet rays. In the case where the photomask 52 includes an infrared-transmissive portion (ultraviolet-blocking portion) having the cold mirror structure and an infrared-blocking portion (ultraviolet-transmissive portion) having the cold filter structure, step S3 and step S4 described above may be performed concurrently. Therefore, in the case where the photomask 52 having such a structure is used, the first irradiation optical system and the second irradiation optical system each include an ultraviolet, lamp and the photomask.

In each of the film formation devices 200A and 200B with no photomask, the infrared irradiation device 230R constitutes the first irradiation optical system, and the ultraviolet irradiation device 230U constitutes the second irradiation optical system. In the film formation device 200A, the first irradiation optical system may have a structure in which, for example, an infrared lamp is used as the infrared light source of the infrared irradiation device 230R and the photomask 52 includes an infrared-transmissive portion.

With reference to FIG. 9, an example of first region to be irradiated with the first light by the first irradiation optical system will be described. FIG. 9(*a*) and FIG. 9(*b*) are each a schematic perspective view showing an example of first region.

The element substrate 20 includes a plurality of OLED display device portions 100p, each of which is to be an OLED display device. After the thin film encapsulation structure is formed on the element substrate 20, the element substrate 20 is divided into individual OLED display device portions 100p. A post-process is performed when necessary, and thus the OLED display devices are obtained.

In the OLED display device 100A shown in FIG. 3, the first region includes the region NR1 and the region NR2. Both of the region NR1 and the region NR2 is a part of the OLED display device 100A. The first region may be modified in any of various manners.

For example, referring to FIG. 9(a), the first region may be a first region 42a extending along each six OLED display device portions 100p arrayed in a column direction. The first region 42a shown in FIG. 9(a) may include, for example, the region NR1 and the region NR2 shown in FIG. 3. As can be seen, in the case where the first region extends along a plurality of OLED display device portions, the first irradiation optical system is simplified.

Referring to FIG. 9(b), the first region may be an annular first region 42b enclosing the active region of each of the OLED display device portions 100p. In the case where the first region 42b is annular, the active region is enclosed by the inorganic barrier layer joint portion with more certainty. For example, according to the method for forming the TFE structure 10A, the photocurable resin is located locally, more specifically. In the vicinity of the protruding portion of the first inorganic barrier layer. Therefore, except for the particle P, the photocurable resin is located locally, more specifically, only in the lowermost portion of the first inorganic barrier layer 12A covering the lead wire 30A (a border portion between a portion covering the side surface of the lead wire 30A and a portion formed on the flat portion of the substrate 1). Therefore, in the case where the region NR1 (dividing region) shown in FIG. 3 is used as the first region, moisture is prevented from entering the active region via the organic barrier layer 14A. However, it is not absolutely impossible that the photocurable resin is attached to a portion where the photocurable resin is not to be attached. Therefore, the annular first region 42b may be formed in order to avoid such an undesirable situation although the possibility that this occurs is very low. The annular first region 42b is preferably usable for a method for producing an OLED display device according to embodiment 2, which includes the step of forming the liquid film of the photocurable resin almost on the entirety of the first inorganic barrier layer.

The first regions 42a and 42b shown in FIG. 9(a) and FIG. 9(b) may be irradiated by, for example, the first irradiation optical system (infrared irradiation device 230R) including a semiconductor laser element and an optical element (lens, diffractive element, etc.). In the case where a beam is to be used for scanning, the entirety of the first region 42a or 42b needs to be kept in a state of having a sufficiently raised temperature. This requires the intensity of the beam or scanning conditions to be adjusted. For this purpose, the film formation device may further include, for example, a thermoviewer (infrared thermography device) directed toward the top surface of the stage. While the temperature distribution on the element substrate is monitored by the thermoviewer, the intensity of the beam or the scanning conditions of the infrared irradiation device 230R may be optimized.

FIG. 10(a) and FIG. 10(b) respectively and schematically show photomasks 52A and 52B usable to direct the first light. In the case where infrared rays with no directivity are emitted from an ultraviolet lamp (e.g., high-pressure mercury lamp) or an infrared lamp (e.g., halogen lamp), the photomask 52A or 52B may be used to allow the first region to be selectively irradiated with the infrared rays.

Now, with reference to FIG. 11 and FIG. 12, a structure of another OLED display device 100B according to embodiment 1 of the present invention will be described.

Figure 11:
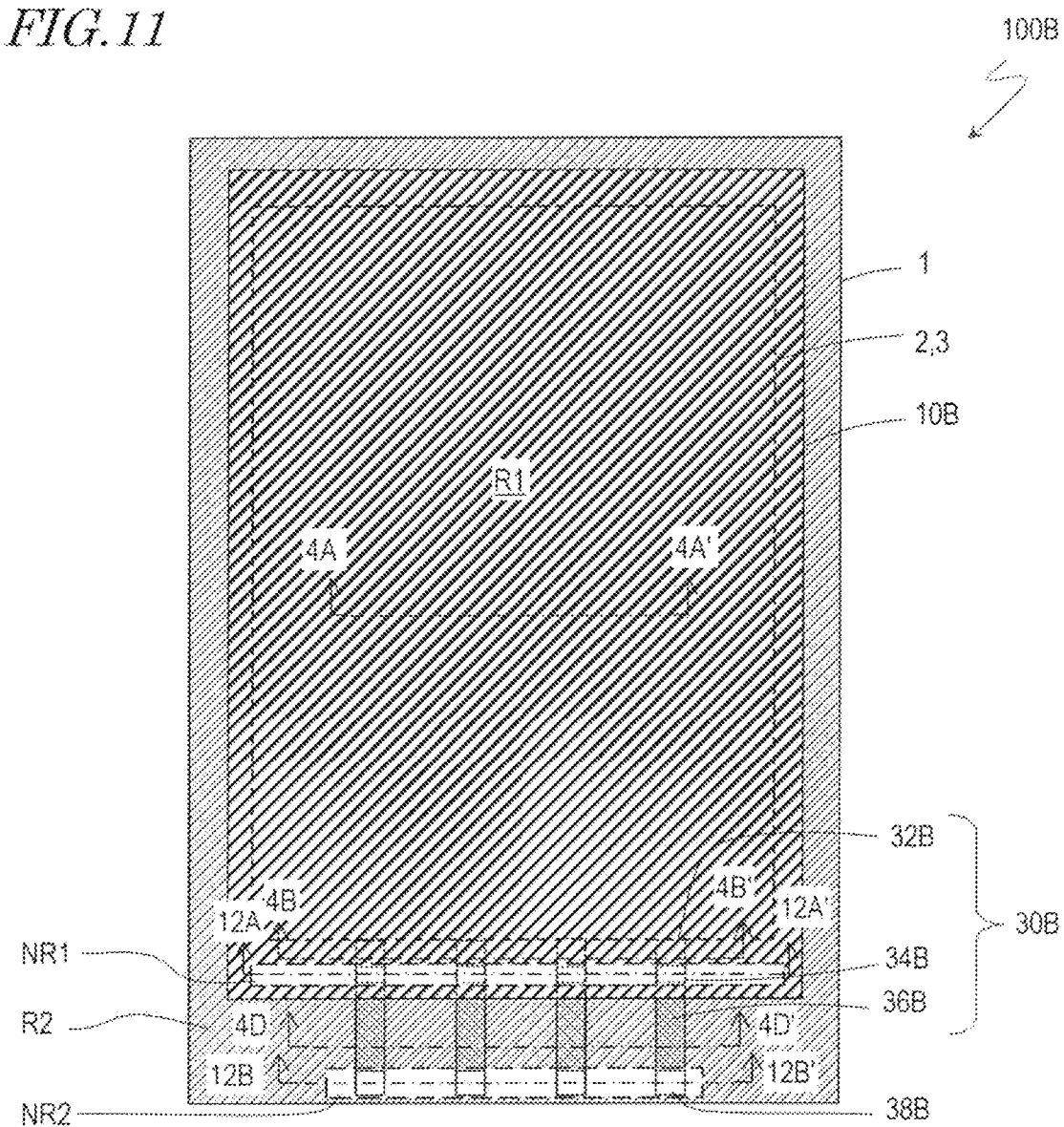
FIG. 11 is a plan view schematically showing a structure of another OLED display device 100B according to embodiment 1 of the present invention.

FIG. 11 is a plan view schematically showing a structure of the OLED display device 100B. FIG. 12(a) and FIG. 12(b) are schematic cross-sectional views of the OLED display device 100B. FIG. 12(a) is a cross-sectional view taken along line 12A-12A' in FIG. 11, and FIG. 12(b) is a cross-sectional view taken along line 12B-12B' in FIG. 11.

The OLED display device 100B shown in FIG. 11 is different from the OLED display device 100A shown in FIG. 3 in the cross-sectional, structure of portions 34B of the lead wires 30B, the portions 34B overlapping the region NR1, and the terminals 38B. In FIG. 11, elements having substantially the same functions as those in the OLED 100a bear the same reference signs thereto, and description thereof may be omitted.

As described above with reference to FIG. 4(b) regarding the OLED display device 100A, the photocurable resin is easily located locally, more specifically, in a portion of the first inorganic barrier layer 12A, the portion having a surface that forms an angle of 90 degrees or larger. Oppositely described, the photocurable resin is not easily located in a portion of the first inorganic barrier layer 12A, the portion having a surface that forms an angle smaller than 90 degrees.

Therefore, as shown in FIG. 12(a) and FIG. 12(b), in the OLED display device 100B, the portions 34B of the lead wires 30b overlapping the region NR1 and the region NR2 and the terminals 38B have a forward tapering side surface portion (inclining side surface portion) TSF having a tapering angle smaller than 90 degrees. In this manner, the photocurable resin is suppressed from being located locally.

The tapering angle of the forward tapering side surface portion is preferably 85 degrees or smaller, and is more preferably 70 degrees or smaller. In a portion including the forward tapering side surface portion TSF, a surface of a first inorganic barrier layer 12B does not form an angle of 90 degrees or larger. Therefore, the photocurable resin is not easily located. Even if an organic material is located locally, more specifically, in a portion where the surface of the first inorganic barrier layer 12B forms an angle smaller than 90 degrees, the amount of the organic material is smaller than in the portion where the surface of the first inorganic barrier layer 12B forms an angle of 90 degrees or larger. For this reason, the region NR1 and the region NR2 may be irradiated with the first light, so that a region where the photocurable resin is not present is formed in the region NR1 and the region NR2 with more certainty. Namely, the inorganic barrier layer joint portion, where the first inorganic barrier layer 12B and a second inorganic barrier layer 16B are in direct contact with each other, is formed more certainly in the region NR1.

A cross-sectional view taken along line 4B-4B' including a portion 32B in FIG. 11, and a cross-sectional view taken along line 4D-4D' including a portion 36B in FIG. 11, may respectively be the same as the cross-sectional view shown in FIG. 4(b) and the cross-sectional view shown in FIG. 4(d). In this case, in the step of forming the lead wires 30B, the lead wires 30B may each be formed to include the forward tapering side surface portion TSF by one exposure step by a photolithography step using a multi-gray scale mask (half-tone mask or gray-tone mask). In this specification, the "photolithography step" includes resist supply, exposure, development, etching using the resist as a mask, and peel-off of the resist.

Now, FIG. 13(a) and FIG. 13(b) will be referred to. FIG. 13(a) and FIG. 13(b) are respectively schematic partial cross-sectional views of TFE structures 10C and 10D included in other OLED display devices according to embodiment 1.

FIG. 13(a) is a schematic cross-sectional view of the TFE structure IOC taken along line 4B-4B' in FIG. 3, more specifically, is a cross-sectional view of portions 32C of the lead wires, the portions 32C being closer to the active region R1.

In the case where, for example, the lead wires 30A having a cross-sectional shape shown in FIG. 4(b) are to be formed, the portions 32C each having inversely tapering side surfaces as shown in FIG. 13(4) may undesirably be formed due to variance in the process conditions. When the inversely tapering side surfaces are formed, a first inorganic barrier layer 12C becomes discontinuous. Even in this case, an organic barrier layer 14C is formed on a lowermost portion of each of side surfaces of the portions 32C of the lead wires, so that a second inorganic barrier layer 16C with no defect is formed thereon. In this runner, in the case where the particle P is present or in the case where a pattern having an inversely tapering cross-sectional shape is formed, the organic barrier layer 14C suppresses the level of moisture-resistance reliability from being decreased.

FIG. 13(b) is a schematic cross-sectional view of the TFE structure 10D taken along line 4C-4C in FIG. 3. In the TFE structure 10B shown In FIG. 12(a), the entirety of each side surface of the portions. 34B is a forward tapering side surface portion TSF. As shown in FIG. 13(b), portions 34D may each have side surfaces each including a forward tapering side surface portion TSF at least on a lowermost portion thereof. The photocurable resin (e.g., acrylic monomer) is located locally, more specifically, on the lowermost portion of the side surface (border with the flat portion). Therefore, it is sufficient to suppress the photocurable resin from being located on this portion. It is preferred that, the forward tapering side surface portion TSF has a height (length in a direction normal to the substrate) that is greater than the thickness of the photocurable resin, for example, greater than, or equal to, 50 nm, more preferably greater than, or equal to, 100 nm. It is preferred that the portion of each of the lines that includes the forward tapering side surface portion does not include an inversely tapering portion. On the portion 34B having such a cross-sectional shape with no inversely tapering portion, even if the organic barrier layer is not present, a first inorganic barrier layer 12C and a second inorganic barrier layer 16C with no defect are formed.

In consideration of the process margin, the forward tapering side surface portion has a tapering angle smaller than 85 degrees, preferably smaller than, or equal to, 70 degrees. It is preferred that the remaining portions of the lines have a tapering angle set to be larger than 85 degrees and 90 degrees or smaller. It is preferred that the difference in the tapering angles is larger than, or equal to, 15 degrees. There is no specific lower limit on the tapering angle of the forward tapering side surface portion. It is preferred that the tapering angle is larger than, or equal to, 30 degrees, for the following reasons. Even if the tapering angle is smaller than 30 degrees, there is no specific difference in the effect of suppressing the organic material from being located locally. Where the distance between the lines is constant, the resistance of the lines is increased; whereas where the resistance of the lines is constant, the distance between the lines is decreased. It is preferred that the gate bus lines, the source bus lines, the lead wires and the terminals having such a cross-sectional shape are formed by dry etching. The tapering angle of the forward tapering side surface portion may be adjusted by the pattern of the multi-gray scale mask (half-tone mask or gray-tone mask), and the tapering angle of the remaining portions of the lines may be adjusted by the dry etching conditions.

Now, with reference to FIG. 14 and FIG. 15, an example of TFT usable for the OLED display device 100A, and an example of lead wires and terminals formed by use of a gate metal layer and a source metal layer used to form the TFT, will be described.

For a medium- or small-sized high-definition OLED display device, a low temperature polycrystalline silicon (hereinafter, referred to simply as "LTPS") TFT or an oxide TFT (e.g., four-component-based (In—Ga—Zn—G-based) oxide TFT containing In (indium), Ga (gallium), Zn (zinc) and O (oxygen)) having a high mobility is preferably used. Structures of, and methods for producing, the LTPS-TFT and the In—Ga—Zn—O-based TFT are well known and will be described below merely briefly.

FIG. 14(a) is a schematic cross-sectional view of an LTPS-TFT $2_pT$. The TFT $2_pT$ may be included in the circuit 2 of the OLED display device 100. The LTPS-TFT $2_pT$ is a top gate-type TFT.

The TFT $2_pT$ is formed on a base coat $2_pp$ on the substrate 1 (e.g., polyimide film). Although not described above, it is preferred that a base coat formed of an inorganic insulating material is formed on the substrate 1.

The TFT $2_pT$ includes a polycrystalline silicon layer $2_pse$ formed on the base coat $2_pp$, a gate insulating layer $2_pgi$ formed on the polycrystalline silicon layer $2_pse$, a gate electrode $2_pg$ formed on the gate insulating layer $2_pgi$, an interlayer insulating layer $2_pi$ formed on the gate electrode $2_pg$, and a source electrode $2_pss$ and a drain electrode $2_psd$ formed on the interlayer insulating layer $2_pi$. The source electrode $2_pss$ and the drain electrode $2_psd$ are respectively connected with a source region and a drain region of the polycrystalline silicon layer $2_pse$ in contact holes formed in the interlayer insulating layer $2_pi$ and the gate insulating layer $2_pgi$.

The gate electrode $2_pg$ is contained in a gate metal layer containing the gate bus lines, and the source electrode $2_pss$ and the drain electrode $2_psd$ are contained in a source metal layer containing the source bus lines. The gate metal layer and the source metal layer are used to form lead wires and terminals (described below with reference to FIG. 15).

The TFT $2_pT$ is formed, for example, as follows.

As the substrate 1, a polyimide film having a thickness of 15 μm, for example, is prepared.

The base coat $2_pp$ ($SiO_2$ film: 250 nm/$SiN_x$ film: 50 nm/$SiO_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is made polycrystalline-siliconized by excimer laser annealing (ELA).

The a-Si film is patterned by a photolithography step to form an active layer (semiconductor island).

A gate insulating film ($SiO_2$ film: 50 nm) is formed by plasma CVD.

A channel region of the active layer is doped with ($B^+$).

The gate metal layer (Mo: 250 nm) is formed by sputtering and patterned by a photolithography step (including a dry etching step) (to form the gate electrode $2_pg$, the gate bus lines, and the like).

A source region and a drain region of the active layer are doped with ($P^+$).

Activation annealing (e.g., annealing at 450° C. for 45 minutes) is performed. As a result, the polycrystalline silicon layer $2_pse$ is formed.

An interlayer insulating film (e.g., SiO$_2$ film: 300 nm/SiN$_x$ film: 300 nm (top layer/bottom layer)) is formed by plasma CVD.

The contact holes are formed in the gate insulating film and the interlayer insulating film by dry etching. As a result, the interlayer insulating layer $2_p$i and the gate insulating layer $2_p$gi are formed.

The source metal layer (Ti film: 100 nm/Al film: 300 nm/Ti film: 30 nm) is formed by sputtering and patterned by a photolithography step (including a dry etching step) (to form the source electrode $2_p$ss, the drain electrode $2_p$sd, the source bus lines, and the like).

FIG. 14(b) is a schematic cross-sectional view of an In—Ga—Zn—O-based TFT $2_o$T. The TFT $2_o$T may be included in the circuit 2 of the OLED display device 100A. The TFT $2_o$T is a bottom gate-type TFT.

The TFT $2_o$T is formed on a base coat $2_o$p on the substrate 1 (e.g., polyimide film). The TFT $2_o$T includes a gate electrode $2_o$g formed on the base coat $2_o$p, a gate insulating layer $2_o$gi formed on the gate electrode $2_o$g, an oxide semiconductor layer $2_o$se formed on the gate insulating layer $2_o$gi, and a source electrode $2_o$ss and a drain electrode $2_o$sd respectively formed on a source region and a drain region of the oxide semiconductor layer $2_o$se. The source electrode $2_o$ss and the drain electrode $2_o$sd are covered with an interlayer insulating layer $2_o$i.

The gate electrode $2_o$g is contained in a gate metal layer containing the gate bus lines, and the source electrode $2_o$ss and the drain electrode $2_o$sd are contained in a source metal layer containing the source bus lines. The gate metal layer and the source metal layer are used to form lead wires and terminals, and thus the TFT $2_o$T may have a structure described below with reference to FIG. 15.

The TFT $2_o$T is formed, for example, as follows.

As the substrate 1, a polyimide film having a thickness of 15 μm, for example, is prepared.

The base coat $2_p$ (SiO$_2$ film: 250 nm/SiN$_x$ film: 50 nm/SiO$_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_o$g, the gate bus lines, and the like).

A gate insulating film (SiO$_2$ film: 30 nm/SiN$_x$ film: 350 nm (top layer/bottom layer)) is formed by plasma CVD, An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/middle layer/bottom layer)) is formed by sputtering and patterned by a photolithography step (including a dry etching step) (to form the source electrode $2_o$ss, the drain electrode $2_o$sd, the source bus lines, and the like).

Activation annealing (e.g., annealing at 300° C. for 120 minutes) is performed. As a result, the oxide semiconductor layer $2_o$se is formed.

Then, an interlayer insulating film $2_o$i (e.g., SiN$_x$ film: 300 nm/SiO$_2$ film: 300 nm (top layer/bottom layer)) is formed by plasma CVD as a protective film.

Now, with reference to FIG. 15(a) through FIG. 15(d), a structure of another OLED display device according to embodiment 1 will be described. The circuit (backplane) of this OLED display device includes the TFT $2_p$T shown in FIG. 14(a) or the TFT $2_o$T shown in FIG. 14(b). The gate metal layer and the source metal layer used to form the TFT $2_p$T or the TFT $2_o$T are used to form a lead wire 30A' and a terminal 38A'. FIG. 15(a) through FIG. 15(d) respectively correspond to FIG. 4(b) through FIG. 4(e). Components corresponding to those in FIG. 4(b) through FIG. 4(e) will be represented by the identical reference signs thereto provided with apostrophe at the end. A base coat 2p in FIG. 15 corresponds to the base coat $2_p$p in FIG. 14(a) and the base coat $2_o$p in FIG. 14(b). A gate insulating layer 2gi in FIG. 15 corresponds to the gate insulating layer $2_p$gi in FIG. 14(a) and the gate insulating layer $2_o$gi in FIG. 14(b). An interlayer insulating layer 2i in FIG. 15 corresponds to the interlayer insulating layer $2_p$i in FIG. 14(a) and the interlayer insulating layer $2_o$i in FIG. 14(b).

As shown in FIG. 15(a) through FIG. 15(d), a gate metal layer 2g and a source metal layer 2s are formed on the base coat 2p, which is formed on the substrate 1. Although not shown in FIG. 4, it is preferred that the base coat 2p formed of an inorganic insulating material is formed on the substrate 1.

With reference to FIG. 15(a) and FIG. 15(b), a structure of a TFE structure 10A' will be described. FIG. 15(a) corresponds to a cross-sectional view taken along line 4B-4B' in FIG. 3, and is a cross-sectional view of a portion 32A' of the lead wire 30A', the portion 32A' being closer to the active region. FIG. 15(b) corresponds to a cross-sectional view taken along line 4C-4C' in FIG. 3, and is a cross-sectional view of a portion 34A' overlapping the region NR1.

As shown in FIG. 15(a) through FIG. 15(c), the lead wire 30A' is formed as a stack body of the gate metal layer 2g and the source metal layer 2s. A portion of the lead wire 30A' that is formed of the gate metal layer 2g has, for example, the same cross-sectional shape as that of the gate bus lines. A portion of the lead wire 30A' that is formed of the source metal layer 2s has, for example, the same cross-sectional shape as that of the source bus lines. In the case of, for example, a 5.7-type display device of 500 ppi, the portion formed of the gate metal layer 2g has a line width of, for example, 10 μm, and a distance between two adjacent such lines is 16 μm (L/S=10/16). The portion formed of the source metal layer 2s has a line width of, for example, 16 μm, and a distance between two adjacent such lines is 10 μm (L/S=16/10).

Referring to FIG. 15(a), the portion 32A' of the lead wire 30A' closer to the active region has a side surface having a tapering angle of about 90 degrees in a cross-section parallel to a line width direction thereof, like that of the gate bus lines and the source bus lines. An organic barrier layer (solid portion) 14A' is formed on a lowermost portion of a first inorganic barrier layer 12A' covering the portion 32A' of the lead wire 30A' (at a border between a portion covering a side surface of the lead wire 30A' and a portion formed on the flat portion of the substrate 1).

By contrast, referring to FIG. 15(b), the portion 34A' of the lead wire 30A', in a cross-section taken along line 4C-4C' of FIG. 3, is covered with the inorganic barrier joint portion, in which the first inorganic barrier layer 12A' and the second inorganic barrier layer 16A' are in direct contact with each other. A reason for this is that the photocurable resin (organic barrier layer) is not present in the region NR1. As described above with reference to FIG. 12(a), the portion 34A' may include a forward tapering side surface portion (inclining side surface portion) TSF having a tapering angle smaller than 90 degrees.

Now, FIG. 15(c) and FIG. 15(d) will be referred to. FIG. 15(c) and FIG. 15(d) are each a cross-sectional view of a region where the TFE structure 10A' is not formed. A portion 36A' of the lead wire 30A' shown in FIG. 15(c) has a cross-sectional shape substantially the same as that of the portion 32A' of the lead wire 30A' shown in FIG. 15(a), and the organic barrier layer 14A' is formed on a lowermost portion of a side surface of the portion 36A'. A terminal 38A' shown in FIG. 15(d) is present in the region NR2, and therefore, the photocurable resin (organic barrier layer) is not present in the terminal 38A'. As described above with reference to FIG. 12(b), the terminal 38A' may include a forward tapering side surface portion (inclining side surface portion) TSF having a tapering angle smaller than 90 degrees.

FIG. 15(b) shows an example in which each of the two side, surfaces of the lead wire 30A' that are in contact with the first inorganic barrier layer 12A' is entirety the forward tapering side surface portion TSF. As described above with reference to FIG. 5(b), as long as there is a forward tapering side surface portion TSF at least on a lowermost portion of each of the two side surfaces in contact with the first inorganic barrier layer 12A1, the above-described effect is provided. Similarly, FIG. 15(d) shows an example in which each of all the exposed side surfaces of the terminal 38A' is entirety the forward tapering side surface portion TSF. As long as there is a forward tapering side surface portion TSF at least on a lowermost portion of each of all the exposed side surfaces, the above-described effect is provided.

EMBODIMENT 2

The method for producing the OLED display device according to embodiment 1, by which the acrylic monomer is located locally, has a problem that the process margin is narrow. A method for producing an OLED display device in embodiment 2 described below includes a step of forming a resin layer (e.g., acrylic resin layer) also at least on a part of the flat portion and partially ashing the resin layer to form an organic barrier layer. The organic barrier layer may be formed in any of various forms by adjusting the thickness of a resin layer to be formed initially (e.g., to less than 100 nm) and/or by adjusting the ashing conditions (including time). Namely, the organic barrier layer 14A included in the OLED display device 100A described in embodiment 1 may be formed, or an organic barrier layer (solid portion) covering a part of, or the entirety of, the flat portion may be formed. The method for producing the OLED display device 100A according to embodiment 1 may be changed such that the organic barrier layer 14A, after being formed, is partially ashed. As described below, the ashing improves the adhesiveness between the organic barrier layer 14A and the second inorganic barrier layer. In addition, the ashing allows the region or the form, of the organic barrier layer 14A to be left in a final state, to be adjusted.

An organic barrier layer having a large area size provides an effect of improving the resistance against bending. In the following, an OLED display device including a TFE structure that includes an organic barrier layer (solid portion) covering a part of, or the entirety of, the flat portion, and a method for producing the same, will be mainly described. The structure of the element substrate before the TFE structure is formed, especially, the structure of the lead wires and the terminals, and the structure of the TFE structure, may be any of those described in embodiment 1.

Figure 16:
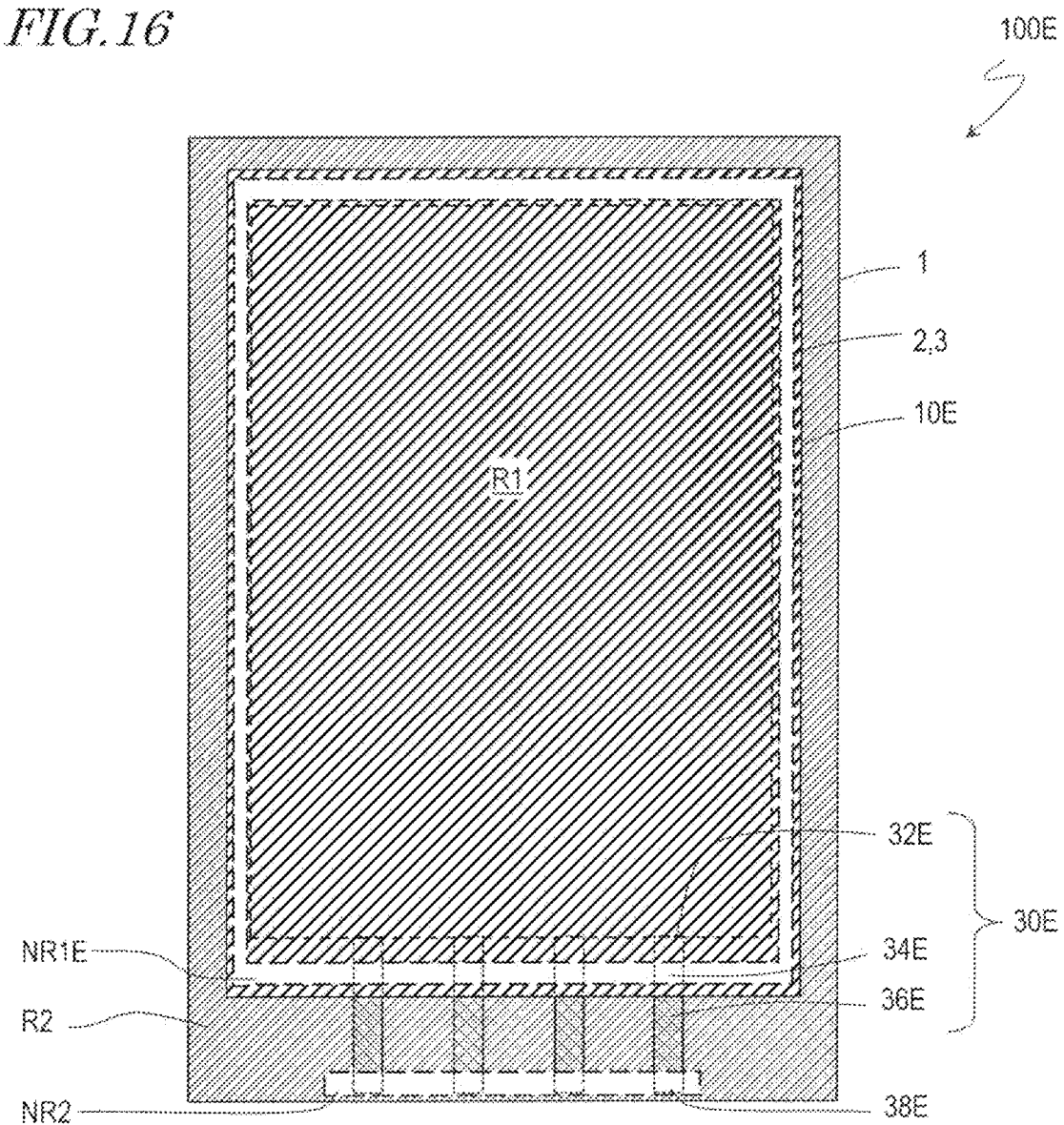
FIG. 16 is a plan view schematically showing a structure of an OLED display device 100E according to embodiment 2 of the present invention.

FIG. 16 schematically shows a planar structure of an OLED display device 100E according to embodiment 2 of the present invention. Elements having substantially the same functions as those in the OLED 100A bear the same reference signs thereto, and description thereof will be omitted.

Structures of portions 32E, 34E and 36E of the lead wires 30E and terminals 38E, and a stack structure including these elements, of the OLED display device 100E may be the same as described in FIG. 4(b) through FIG. 4(e) regarding the portions 32A, 34A and 36A of the lead wires 30A and the terminals 38A of the OLED display device 100A. Thus, descriptions thereof will be emitted. It should be noted that the OLED display device 100E may include the organic barrier layer (solid portion) also on the flat portion as described above. Therefore, the organic barrier layer 14A shown in FIG. 4(b) and FIG. 4(d) may extend onto the flat portion.

The OLED display device 100E may include the organic barrier layer also on the flat portion. Therefore, the region NR1 is irradiated with the first light to prevent the photocurable resin from being present in the region NR1, and thus to form the inorganic barrier layer joint portion enclosing the active region R1.

Hereinafter, differences in the cross-sectional structure between the organic barrier layer in embodiment 2 and the organic barrier layer in the OLED display device 100A shown in FIG. 4(a) will be mainly described.

Figure 18:
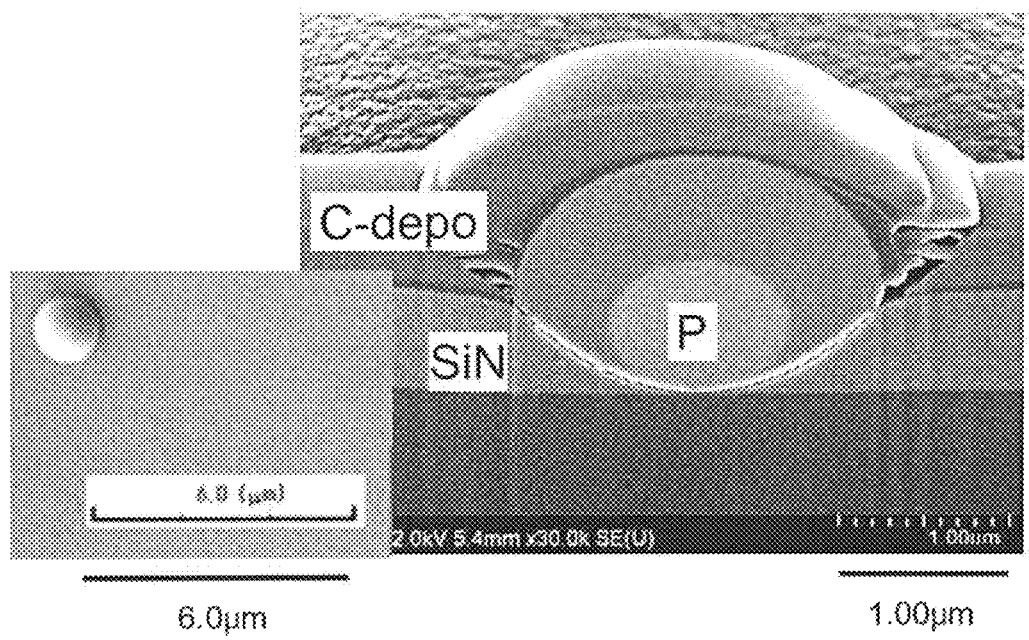
FIG. 18 shows a cross-sectional SEM image of a first inorganic barrier layer (SiN layer) covering a particle (silica sphere having a diameter of 1 μm), and also shows a planar SEM image (left bottom).

FIG. 17(a) is a schematic partial cross-sectional view of a TFE structure 10E in the OLED display device according to embodiment 2 of the present invention, and shows a portion including a particle P. As described above with reference to FIG. 5(b), in the case where the particle P is present, a crack (defect) 12Ec may be formed in a first inorganic barrier layer 12E. Based on a cross-sectional SEM image shown in FIG. 18, this is considered to be caused by impingement of an SiN layer 12Ea growing from a surface of the particle P and an SiN layer 12Eb growing from the flat portion of the surface of the OLED 3. In the case where such a crack 12Ec is present, the level of barrier property of the TFE structure 10E is decreased. The cross-sectional SEM image shown in FIG. 18 is of a sample of SiN film formed by plasma CVD in the state where a silica sphere having a diameter of 1 μm is located as the particle P on a glass substrate. The cross-section does not pass the center of the particle P. An outermost surface of the particle P is a carbon layer (C-depo) used to protect the sphere at the time of cross-sect ion processing. As can be seen, mere presence of a relatively small silica sphere having a diameter of 1 μm results in the formation of the crack (defect) 12Ec in the SiN layer 12E.

Figure 19:
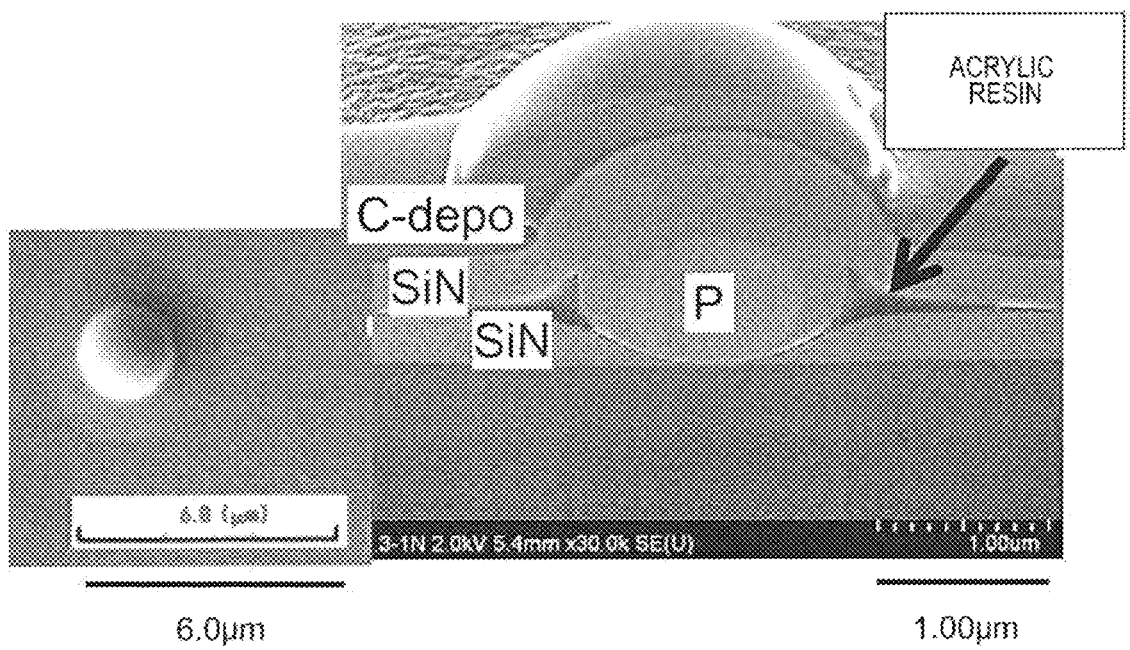
FIG. 19 shows a cross-sectional SEM image of a TFE structure covering a particle (silica sphere having a diameter of 2.15 μm), and also shows a planar SEM image (left bottom).

In the TFE structure 10E in the OLED display device in embodiment 2, as shown in FIG. 17(a), an organic barrier layer 14Ec is formed to fill the crack 12Ec of the first inorganic barrier layer 12E and a portion of the inorganic barrier layer 12E, the portion being overhung by the particle P. Therefore, the level of barrier property is kept high by a second inorganic barrier layer 16E. This may be confirmed by a cross-sectional SEM image shown in FIG. 19. In FIG. 19, no interface is observed at a position where the second inorganic barrier layer 16E is formed directly on the first inorganic barrier layer 12E. In the schematic view, however, the first inorganic barrier layer 12E and the second inorganic barrier layer 16E are shown with different types of hatching for easier understanding.

The cross-sectional SEM image shown in FIG. 19 is of a sample of the TFE structure 10E formed in the state where a silica sphere having a diameter of 2.15 μm is located on a glass substrate, like the cross-sectional SEM image shown in FIG. 18. As can be seen from a comparison between FIG. 19 and FIG. 18, the diameter of the particle P shown in FIG. 19 is about twice the diameter of the particle P shown in FIG. 18. It is seen that even in the case of FIG. 19, the SiN film formed on the acrylic resin layer is a fine film with no defect. Another sample may be formed as follows. An SiN film is formed by plasma CVD so as to cover particles P (silica spheres having a diameter of 2.15 μm and a diameter of 4.6 μm), and then an acrylic resin layer is formed as the organic barrier layer 14E. Then, another SiN film is formed by plasma CVD, Like in the case of FIG. 18, in this sample also, the SiN film formed on the acrylic resin layer has been Observed by an SEM to be a fine film with no defect.

It is preferred that the organic barrier layer 14E shown in FIG. 17(a) is formed of, for example, an acrylic resin. It is especially preferred that the organic barrier layer 14E is formed by curing an acrylic monomer (acrylate) having a viscosity of about 1 to about 100 mPa·s at room temperature (e.g., 25° C.) by light (e.g., ultraviolet rays). An acrylic monomer having such a low viscosity may easily permeate the crack 12Ec and the portion overhung by the particle P.

A surface of the organic barrier layer 14Ec filling the crack 12Ec and the portion overhung by the particle P couples a surface of the first inorganic barrier layer 12Ea on the particles P and a surface of an organic barrier layer 14Eb formed on the flat portion of the surface of the OLED 3 to each other continuously and smoothly. Therefore, the second inorganic barrier layer (SiN layer) 16E formed on the first inorganic barrier layer 12E on the particle P and the organic barrier layer 14E is fine with no defect.

A surface 14Es of the organic barrier layer 14E has been oxidized by ashing, is hydrophilic, and is highly adhesive to the second inorganic barrier layer 16E.

In order to improve the resistance against bending, it is preferred that the organic barrier layer 14E is ashed so as to be left in substantially the entirety thereof except for the protruding portion of the first inorganic barrier layer 12Ea formed on the particle P. It is preferred that the organic barrier layer 14Eb present on the flat portion has a thickness of 10 nm or greater.

Patent Documents Nos. 2 and 3 each describe a structure in which the organic barrier layer is located locally. As a result of various experiments performed by the present inventor, it has been found out that the organic barrier layer 14E may be formed on substantially the entirety of the flat portion, more specifically, on substantially the entirety of the flat portion except, for the protruding portion of the first inorganic barrier layer 12Ea. It is preferred that from the point of the resistance against bending, the thickness of the organic barrier layer 14E is 10 nm or greater.

In the case where the organic barrier layer 14E is provided between the first inorganic barrier layer 12E and the second inorganic barrier layer 16E, the adhesiveness between the layers in the TFE structure 10E is improved. Especially because the surface of the organic barrier layer 14E is oxidized, the organic barrier layer 14E is highly adhesive with the second inorganic barrier layer 16E.

In the case where the organic barrier layer 14Eb is formed on the entirety of the flat portion (in the case where the organic barrier layer 14E does not include any opening 14Ea), when an external force is applied to the OLED display device, the stress (strain) caused to the inside of the TFE structure 10E is uniformly dispersed. As a result, destruction (especially, destruction of the first inorganic barrier layer 12E and/or the second inorganic barrier layer 16E) is suppressed. The organic barrier layer 14E, which is present substantially uniformly in close contact with the first inorganic barrier layer 12E and the second inorganic barrier layer 16E, is considered to act to disperse and alleviate the stress. As can be seen, the organic barrier layer 14E also provides an effect of improving the resistance against bending of the OLED display device.

It should be noted that in the case where the thickness of the organic barrier layer 14E is 200 nm or greater, the resistance against bending may be decreased. Therefore, it is preferred that the thickness of the organic barrier layer 14E is less than 200 nm.

The organic barrier layer 14E is formed after ashing. Ashing may possibly be varied in the plane. Therefore, there may be a case where the organic barrier layer 14E formed on the flat portion is partially removed in the entire thickness thereof to expose the surface of the first inorganic barrier layer 12E. In this case, a portion of the organic barrier layer 14E, more specifically, the organic barrier layer (solid portion) 14Eb formed on the flat portion of the OLED 3, is controlled to have a larger area size than that of the opening 14Ea. Namely, it is controlled such that the area size of the solid portion 14Eb exceeds 50% of the area size of the organic barrier layer (including the opening) 14E on the flat portion. It is preferred that the area size of the solid portion 14Eb is 80% or greater of the area size of the organic barrier layer 14E on the flat portion. Nonetheless, it is preferred that the area size of the solid portion 14Eb does not exceed about 90% of the area size of the organic barrier layer on the flat portion. In other words, it is preferred that the total area size of the opening 14Ea is about 10% of the area size of the organic barrier layer 14E on the flat portion. The opening 14Ea provides an effect of suppressing delamination at the interface between the first inorganic barrier layer 12E and the organic barrier layer 14E and at the interface between the organic barrier layer 14E and the second inorganic barrier layer 16E. In the case where the area size of the opening 14Ea is 80% or greater and 90% or less of the organic barrier layer 14E on the flat portion, an especially high resistance against bending is provided.

If the organic barrier layer 14E is formed on the entirety of the flat portion, the organic barrier layer 14E on the flat portion acts as a moisture entrance route to decrease the level of moisture-resistance reliability of the OLED display device. In order to avoid this, a region NR1E substantially enclosing the active region R1 is irradiated with the first light, so that the organic barrier layer 14E is not formed in the region NR1E. In addition, as shown in FIG. 17(b), a bank 3EB substantially enclosing the active region R1 may be provided on an underlying surface for the organic barrier layer 14E (e.g., surface of the OLED 3) so as to overlap the region NR1E. The bank 3EB includes a forward tapering side surface portion TSF at least on a lowermost portion of each of two exposed side surfaces thereof. The forward tapering side surface portion TSF has a tapering angle smaller than SO degrees in a cross-section of the bank 3EB parallel to a width direction thereof. It is preferred that the forward tapering side surface portion TSF has a height (length in a direction normal to the substrate) that is greater than the thickness of the organic material (approximately equal to the thickness of the organic barrier layer 14E), for example, greater than, or equal to, 50 nm, preferably greater than, or equal to, 100 nm.

The bank 3EB may be formed by any of various methods. For example, in a step of forming the circuit 2, a bank defining the pixels including the OLEDs 3 is formed of a photosensitive resin (e.g., polyimide or acrylic resin). In this step, the bank 3EB enclosing the active region R1 may be formed concurrently. Alternatively, in a step of patterning a gate metal layer and/or a source metal layer to form the gate bus lines and/or the source bus lines, a pattern enclosing the active region (pattern for the bank 3EB) may be formed concurrently. In this step, the pattern for the bank 3EB may be formed by use of a multi-gray scale mask shaped in accordance with the opening, so that the pattern includes the forward tapering side surface portion.

With reference to FIG. 20 and FIG. 21, a step of forming the organic barrier layer 14E and the second inorganic barrier layer 16E, especially, the step of ashing, will be described. FIG. 20 shows the step of forming the organic barrier layer 14E, and FIG. 21 shows the step of forming the second inorganic barrier layer 16E.

As schematically shown in FIG. 20(a), the first inorganic barrier layer 12E covering the particle P on the surface of the OLED 3 is formed, and then the organic barrier layer 14E is formed on the first inorganic barrier layer 12E. The organic barrier layer 14E is formed by, for example, condensing a vapor-like or mist-like acrylic monomer on a cooled element substrate and then irradiating the acrylic monomer with light (e.g., ultraviolet rays) to cure the acrylic monomer. An acrylic monomer having a low viscosity may be used to permeate the crack 12Ec formed in the first inorganic barrier layer 12E.

FIG. 20(a) shows an example in which an organic barrier layer 14Ed is formed on the first inorganic barrier layer 12Ea on the particle P. The acrylic monomer may not possibly be deposited (or attached), or may possibly be deposited (or attached) in merely a trace amount, on the first inorganic barrier layer 12Ea on the particle P, in the case where the particle P is of a certain size or a certain shape or in the case where the acrylic monomer is of a certain type. The organic barrier layer 14E may be formed by use of, for example, the film formation device 200A, 200B or 200C shown in FIG. 7 and FIG. 8 and described above.

A method for forming the TFE structure 10E in a method for producing the OLED display device 100E according to embodiment 2 of the present invention is different as follows from the method for forming the TFE structure 10A shown in the flowchart in FIG. 6. In step S2, in which the photocurable resin is condensed on the first inorganic barrier layer, a liquid film of the photocurable resin is formed. The method includes the step of, after step S4 and before step S5, partially ashing the photocurable resin layer formed by irradiating the liquid film of the photocurable resin with light. As a result of the ashing step, the organic barrier layer 14E is obtained.

In the case where the film formation device 200A is used, for example, the supply amount of the acrylic monomer 26p and the temperature and the pressure (vacuum degree) of the chamber 210 may be controlled to adjust the deposition rate of the acrylic monomer (liquid-state). For example, the acrylic monomer may be deposited at 500 nm/min. Therefore, a liquid film of the acrylic monomer having a thickness of about 200 nm may be formed within about 24 seconds. The thickness of the liquid film is preferably 100 nm or greater and 500 nm or less.

The organic barrier layer 14E is adjusted to have an initial thickness of 100 nm or greater and 500 nm or less on the flat portion. The organic barrier layer 14E in the initial state thus formed has a surface 14Esa, which is smoothly continuous and hydrophobic. For the sake of simplicity, the organic barrier layer in a pre-ashing state bears the same reference sign as that of the organic barrier layer in a post-ashing state.

Then, as shown in FIG. 20(b), the organic barrier-layer 14E is ashed. The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet irradiation, may be performed. In the case where an SiN film is formed by CVD as each of the first inorganic barrier layer 12E and the second inorganic barrier layer 16E, $N_2O$ is used as a material gas. Therefore, use of $N_2O$ tor the ashing provides an advantage that the device is simplified.

Ashing on the organic barrier layer 14E is, for example, plasma ashing performed using $N_2C$ gas. The ashing is performed in an ashing chamber. The ashing is performed at an ashing rate of, for example, 500 nm/min. In the case where the organic barrier layer 14E having a thickness of 200 nm is formed as described above, ashing is performed for about 22 seconds such that the organic barrier layer (solid portion) 14Eb on the flat portion has a thickness (maximum value) of about 20 nm.

The conditions in the above-described step may be adjusted to form the organic barrier layer 14A shown in FIG. 4(a) and FIG. 4(b). A portion of the organic barrier layer 14E that; is on the lead wire is thinner than the other portion of the organic barrier layer 14E. Therefore, the portion of the organic barrier layer 14E that is on the lead wire may be removed to leave more than 50% of the area size of the organic barrier layer 14E on the flat portion.

In the case where the ashing is performed, the surface 14Es of the organic barrier layer 14E is oxidized and thus is modified to be hydrophilic. In addition, the surface 14Es is shaved almost uniformly, and extremely tiny convexed and concaved portions are formed, which increases the surface area size. The effect of increasing the surface area size provided by the ashing is greater for the surface of the organic barrier layer 14E that for the first inorganic barrier layer 12E formed of an inorganic material. Since the surface 14Es of the organic barrier layer 14E is modified to be hydrophilic and the surface area size of the surface 14Es is increased, the adhesiveness of the organic barrier layer 14E with the second inorganic barrier layer 16E is improved.

When the ashing is further advanced, an opening 14Ea is formed in a part of the organic barrier layer 14E as shown in FIG. 20(c).

When the ashing is still further advanced, the organic barrier layer 14Ec may be left only in the crack 12Ec of the first inorganic barrier layer 12E and in the vicinity of the portion overhung by the particle P, like the organic barrier layer 14A shown in FIG. 5(a). In this state, the surface of the organic barrier layer 14Ec couples the surface of the first inorganic barrier layer 12Ea on the particle P and the surface of the flat portion of the OLED 3 to each other continuously and smoothly.

In order to improve the adhesiveness between the first inorganic barrier layer 12E and the organic barrier layer 14E, the surface of the first inorganic barrier layer 12E may be ashed before the organic barrier layer 14E is formed.

After the ashing, the $N_2O$ gas is removed, end the resultant assembly of layers is transported to a CVD chamber in which the second inorganic barrier layer 16E is formed. The second inorganic barrier layer 16E is formed under, for example, the same conditions as those used to form the first inorganic barrier layer 12E.

Now, with reference to FIG. 21, the structure after the second inorganic barrier layer 16E is formed on the organic barrier layer 14E will be described.

FIG. 21(a) schematically shows a structure provided as follows: the surface 14Esa of the organic barrier layer 14E shown in FIG. 20(a) is oxidized by ashing and thus is modified to be a hydrophilic surface 14Es, and then the second inorganic barrier layer 16E is formed. In this example, the surface 14Esa of the organic barrier layer 14E is slightly ashed, so that the organic barrier layer 14Ed is left on the first inorganic barrier layer 12Ea on the particle P. Alternatively, there may be a case where the organic barrier layer 14E is not formed (or is not left) on the first; inorganic barrier layer 12Ea on the particle P.

As shown in FIG. 21(a), the second inorganic barrier layer 16E formed on the organic barrier layer 14E has no defect, and is highly adhesive with the organic barrier layer 14E.

As shown in FIG. 21(b) and FIG. 21(c), the second inorganic barrier layer 16E formed on the organic barrier layer 14E shown in each of FIG. 20(b) and FIG. 20(c) has no defect and is highly adhesive with the organic barrier layer 14E. Even if the organic barrier layer 14E is removed in the entire thickness thereof from the flat portion of the OLED 3, the second inorganic barrier layer 16E has no defect and is highly adhesive with the organic barrier layer 14E as long as the surface of the organic barrier layer 14E couples the surface of the first inorganic barrier layer 12Ea on the particle P and the surface of the flat portion of the OLED 3 to each other continuously and smoothly.

As shown in FIG. 21(b), the organic barrier layer 14E may be ashed so as to be left in a small thickness on the entirety of the surface of the first inorganic barrier layer except for the protruding portion of the first inorganic barrier layer 12Ea formed on the particle P. From the point of view of the resistance against bending, it is preferred that as described above, the thickness of the organic barrier layer 14Eb on the flat portion is 10 mm or greater and less than 200 nm.

Ashing is varied in the plane. Therefore, there may be a case where the organic barrier layer 14E formed on the flat portion is partially removed in the entire thickness thereof to expose the surface of the first inorganic barrier layer 12E. The material and the size of the particle P are also varied. Therefore, a portion having a structure shown in FIG. 21(c) or the structure shown in FIG. 5(a) may possibly be present. Even in the case where the organic barrier layer 14E formed on the flat portion is partially removed in the entire thickness thereof, it is preferred that a portion of the organic barrier layer 14E, more specifically, the organic barrier layer (solid portion) 14Eb formed on the flat portion of the OLED 3, is controlled to have a larger area size than that of the opening 14Ea. As described above, it is preferred that the area size of the solid portion 14Eb is 80% or greater of, but does not exceed about 90% of, the area size of the organic barrier layer 14E on the flat portion.

Figure 22:
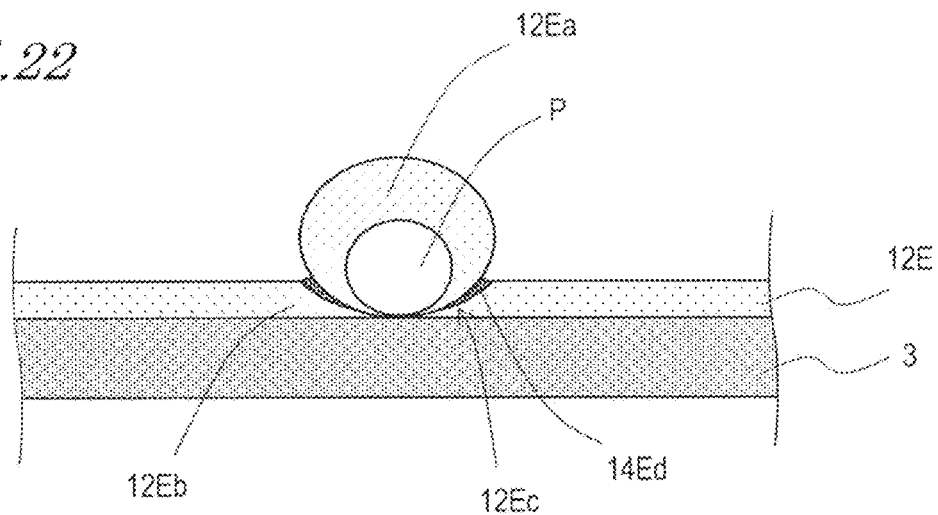
FIG. 22 is a schematic cross-sectional view showing an organic barrier layer 14Ed excessively ashed.
Figure 23:
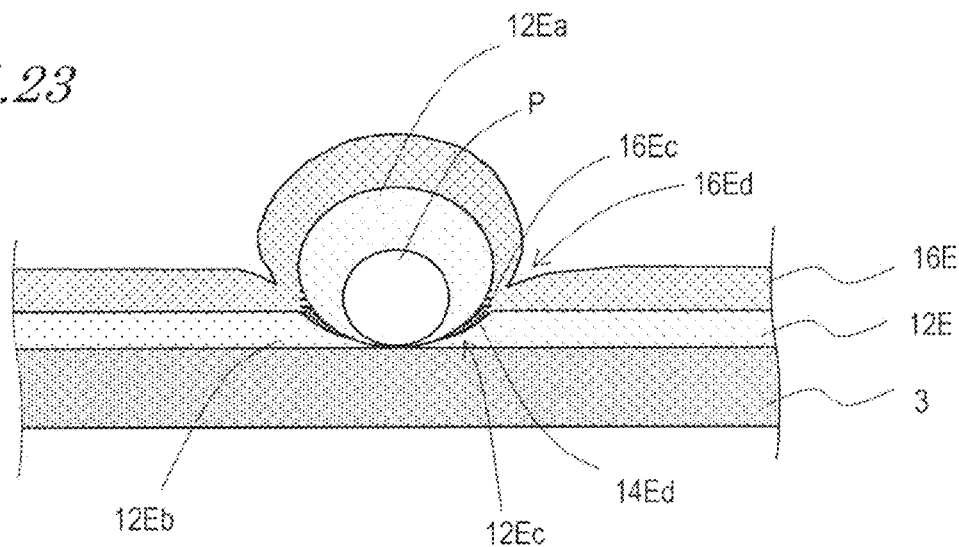
FIG. 23 is a schematic cross-sectional view shewing the second inorganic barrier layer 16E formed on the organic barrier layer 14Ed excessively ashed.

Referring to FIG. 22, in the case where the organic barrier layer 14E is ashed excessively, the organic barrier layer 14Eb formed on the flat portion of the OLED 3 is completely removed, and further the organic barrier layer 14Ed filling the crack 12Ec formed by the particle P is decreased in size and fails to make the surface of the underlying layer for the second inorganic barrier layer 16E continuous and smooth. As a result, as shown in FIG. 23, a defect 16Ec is formed in the second inorganic barrier layer 16E, which decreases the level of barrier property of the TFE structure. Even if the defect 16Ec is not formed, if an acute recessed portion 16Ed is formed at the surface of the second inorganic barrier layer 16E, a stress tends to concentrate at the acute recessed portion 16Ed, which causes a crack to be generated easily by an external force.

In an experiment in which, for example, a silica convex lens (diameter: 4.6 μm) was used as the particle P, there was a case where the organic barrier layer was etched excessively at an end of the silica convex lens, and as a result, the second inorganic barrier layer was made extremely thin partially. In such a case, the second inorganic barrier layer, even if having no defect, may be cracked when an external force is applied to the TFE structure during or after the production of the OLED display device.

An external force nay possibly be applied to the TFE structure in the following cases, for example. When the flexible substrate 1 of the OLED display device is peeled off from a glass substrate as a support substrate, a bending stress acts on the OLED display device including the TFE structure 10. A bending stress also acts on the TFE structure 10 when, during the production of a curved-surface display, the OLED display device is bent along a predetermined curved shape. Needless to say, in the case where the flexibility of the OLED display device is utilized while the OLED display device is used (for example, the OLED display device is folded, bent or rolled), various types of stress are applied to the TFE structure 10 during the use of the OLED display device by the user.

In order to avoid this, it is preferred to adjust the ashing conditions such that more than 50% of the organic barrier layer formed on the flat portion of the OLED 3 is left (such that the area size of the organic barrier layer (solid portion) 14Eb is larger than the area size of the opening 14Ea). It is more preferred that 80% or greater of the organic barrier layer (solid portion) 14Eb formed on the flat portion of the OLED 3 is left, and it is still more preferred that about 90% of the organic barrier layer (solid portion) 14Eb formed on the flat portion of the OLED 3 is left. Nonetheless, it is preferred that the opening 14Ea occupies about 10% of the organic barrier layer 14E because the opening 14Ea having such an area size provides an effect of suppressing delamination at the interface between the first inorganic barrier layer 12E and the organic barrier layer 14E and at the interface between the organic barrier layer 14E and the second inorganic barrier layer 16E. As shown in FIG. 21(a) through FIG. 21(c), the surface of the second inorganic barrier layer 16E formed on the organic barrier layer 14E left in an appropriate amount does not include any portion forming an angle of 90 degrees or smaller (see the recessed portion 16Ed in FIG. 23). Therefore, even if an external force is applied, concentration of the stress is suppressed.

According to embodiments 1 and 2 of the present invention, an OLED display device including a thin film encapsulation structure that includes an inorganic barrier layer joint portion enclosing an active region is produced. How much of the organic barrier layer 14E is to be left may be appropriately changed in accordance with the use of the OLED display device or the required performance.

In the above, embodiments of a method for producing an OLED display device inducing a flexible substrate, and a film formation method and a film formation device usable for the same are described. The embodiments of the present invention are not limited to being applicable to the above-described examples, and are widely applicable to an organic EL device (e.g., organic EL illumination device) including an organic EL element formed on a substrate and a thin film encapsulation structure formed on the organic EL element.

INDUSTRIAL APPLICABILITY

An embodiment of the present invention is applicable to a method for producing an organic EL device and a film formation device used for the method. An embodiment of the present invention is especially preferably applicable to a method for producing a flexible organic EL display device and a film formation device usable for the method.

REFERENCE SIGNS LIST 1 substrate (flexible substrate)
2 circuit (driving circuit or backplane)

3 organic EL element
4 polarizing plate
10, 10A, 10B, 10C, 10E thin film encapsulation structure (TFE structure)
12, 12A, 12B, 12C, 12E first inorganic barrier layer (SiN layer)
14, 14A, 14B, 14E organic barrier layer (acrylic resin layer)
14Ea opening of the organic barrier layer
14Eb solid portion of the organic barrier layer
14Es surface of the organic barrier layer (post-ashing)
14Esa surface of the organic barrier layer (pre-ashing)
16A, 16B, 16C, 16E second inorganic barrier layer (SiN layer)
16Ec defect
16Ed recessed portion
20 element substrate
26 acrylic monomer
26p vapor-like or mist like acrylic monomer
100, 100A organic EL display device

The invention claimed is:

1. A film formation method, comprising:
step A of forming a liquid film of a photocurable resin on a surface of a substrate, the substrate having a protruding potion on the surface and the liquid film being formed in a region including a border between the protruding portion and the substrate;
step B of selectively irradiating a predetermined first region including the border on the surface of the substrate with infrared rays or visible light having a wavelength exceeding 550 nm to vaporize the photocurable resin in the first region; and
step C of, concurrently with, or after, step B, irradiating a second region including the first region on the surface of the substrate with light to which the photocurable resin is photosensitive, to cure the photocurable resin in the second region and thus to obtain a photocurable resin film.

2. The film formation method of claim 1, wherein step A includes step A1 of condensing the photocurable resin, which is vapor-like or mist-like, on the substrate in a chamber accommodating the vapor-like or mist-like photocurable resin.

3. A method for producing an organic EL device, comprising the steps of:
preparing an element substrate including a substrate, a driving circuit formed on a surface of the substrate, a plurality of organic EL elements connected with the driving circuit, a plurality of terminals located in a peripheral region outer to an active region, in which the plurality of EL elements are located, and a plurality of lead wires connecting the driving circuit and the plurality of terminals to each other; and
forming a thin film encapsulation structure on the active region of the element substrate and a portion of each of the plurality of lead wires, the portion being closer to the active region,
wherein the step of forming the thin film encapsulation structure includes:
step S1 of forming a first inorganic barrier layer selectively on the active region and the portion of each of the plurality of lead wires closer to the active region,
step S2 of, after step S1, condensing the photocurable resin, which is vapor-like or mist-like, on a surface of the first inorganic barrier layer in a chamber accommodating a photocurable resin,
step S3 of, after step S2, selectively irradiating a predetermined first region, on a surface of the element substrate, including a dividing region crossing the plurality of lead wires with infrared rays or visible light having a wavelength exceeding 550 nm to vaporize the photocurable resin in the first region;
step S4 of, concurrently with, or after, step S3, irradiating a second region including the first region on the surface of the element substrate with light to which the photocurable resin is photosensitive, to cure the photocurable resin in the second region and thus to form an organic barrier layer formed of the photocurable resin; and
step S5 of, after step S4, forming a second inorganic barrier layer selectively on the active region and a portion of each of the lead wires closer to the active region to form an inorganic barrier layer joint portion, where the first inorganic barrier layer and the second inorganic barrier layer are in direct contact with each other, in at least the dividing region in the first region.

4. The method for producing an organic EL device of claim 3, further comprising the step of partially ashing the organic barrier layer after step S4 but before step S5.

5. The method for producing an organic EL device of claim 3, wherein the first region includes an annular region substantially enclosing the active region.

6. The method for producing an organic EL device of claim 3, wherein the first region has a width of at least 0.01 mm.

7. The method for producing an organic EL device of claim 3, wherein the organic barrier layer has a thickness of 100 nm or greater and 500 nm or less.

8. The method for producing an organic EL device of claim 3, wherein the photocurable resin contains a vinyl group-containing monomer.

9. The method for producing an organic EL device of claim 3, wherein the substrate is a flexible substrate.

10. A film formation device, comprising:
a chamber;
a stage located in the chamber and having a top surface receiving the substrate, the stage being capable of cooling the top surface;
a first irradiation optical system selectively irradiating a predetermined first region on a surface of the substrate located on the top surface of the stage with infrared rays or visible light having a wavelength exceeding 550 nm; and
a second irradiation optical system irradiating a second region including the first region on the surface of the substrate located on the top surface of the stage with ultraviolet rays and/or visible light having a wavelength of 450 nm or shorter.

11. The film formation device of claim 10, wherein the first irradiation optical system includes an infrared light emitting semiconductor element.

12. The film formation device of claim 10, wherein the first irradiation optical system further includes a photomask including an infrared-transmissive portion corresponding to the first region.

13. The film formation device of claim 10, wherein the first irradiation optical system further includes an infrared laser element and a movable mirror for scanning the infrared laser element.

14. The film formation device of claim 10, wherein the second irradiation optical system includes an ultraviolet light source.

15. The film formation device of claim 10, further comprising an ultraviolet lamp and a photomask including an infrared-transmissive portion corresponding to the first region,
- wherein the first irradiation optical system includes the ultraviolet lamp and the photomask, and
- wherein the second irradiation optical system has a structure in which the photomask is retracted from the first irradiation optical system.

16. The film formation device of claim 15, wherein the photomask includes a glass substrate and a cold mirror structure provided on a surface of a region of the glass substrate, the region acting as the infrared-transmissive portion.

17. The film formation device of claim 16, wherein the photomask includes a metal film on a surface of another region of the glass substrate, the other region excluding the region acting as the infrared-transmissive portion, and the metal film has a thickness of 500 nm or greater.

18. The film formation device of claim 16, wherein the photomask includes a cold filter structure on a surface of another region of the glass substrate, the other region excluding the region acting as the infrared-transmissive portion.

* * * * *